US012149227B2

(12) United States Patent
Turner et al.

(10) Patent No.: US 12,149,227 B2
(45) Date of Patent: *Nov. 19, 2024

(54) TRANSVERSELY-EXCITED FILM BULK ACOUSTIC RESONATOR PACKAGE

(71) Applicant: MURATA MANUFACTURING CO., LTD, Kyoto (JP)

(72) Inventors: Patrick Turner, San Bruno, CA (US); Mike Eddy, Santa Barbara, CA (US); Andrew Kay, Irvine, CA (US); Ventsislav Yantchev, Sofia (BG)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 792 days.

This patent is subject to a terminal disclaimer.

(21) Appl. No.: 17/082,973

(22) Filed: Oct. 28, 2020

(65) Prior Publication Data
US 2021/0044276 A1    Feb. 11, 2021

Related U.S. Application Data

(60) Continuation-in-part of application No. 16/998,300, filed on Aug. 20, 2020, and a continuation-in-part of
(Continued)

(51) Int. Cl.
*H03H 9/25* (2006.01)
*H03H 9/02* (2006.01)
(Continued)

(52) U.S. Cl.
CPC .......... *H03H 9/25* (2013.01); *H03H 9/02228* (2013.01); *H03H 9/02992* (2013.01);
(Continued)

(58) Field of Classification Search
CPC ........... H03H 9/02228; H03H 9/02015; H03H 9/205; H03H 9/54
(Continued)

(56) References Cited

U.S. PATENT DOCUMENTS 5,446,330 A    8/1995  Eda et al.
5,552,655 A    9/1996  Stokes et al.
(Continued)

FOREIGN PATENT DOCUMENTS

CN    106788318 A    5/2017
CN    110417373 A    11/2019
(Continued)

OTHER PUBLICATIONS

Buchanan "Ceramit Materials for Electronics" 3rd Edition, first published in 2004 by Marcel Dekker, Inc. pp. 496 (Year 2004). 00 Jan. 2004.
(Continued)

*Primary Examiner* — Hafizur Rahman
(74) *Attorney, Agent, or Firm* — ARENTFOX SCHIFF LLP

(57) ABSTRACT

Acoustic resonator devices and filters are disclosed. A piezoelectric plate is attached to a substrate, a portion of the piezoelectric plate forming a diaphragm spanning a chip cavity in the substrate. A first conductor pattern is formed on a surface of the piezoelectric plate. The first conductor pattern includes interleaved fingers of an interdigital transducer on the diaphragm, and first contact pads. An interposer has walls on its back surface that are attached to the chip front surface and that surround the diaphragm. An interposer cover layer spans the walls creating an enclosed interposer cavity over the diaphragm. A second conductor pattern formed on the walls and cover layer includes second contact pads on the interposer back surface. Electrical connections between the second contact pads and connection points on the chip electrically connect the first contact pads to respective ones of the second contact pads.

20 Claims, 18 Drawing Sheets

Related U.S. Application Data application No. 16/920,173, filed on Jul. 2, 2020, now Pat. No. 11,139,794, said application No. 16/998,300 is a division of application No. 16/841,134, filed on Apr. 6, 2020, said application No. 16/920,173 is a continuation of application No. 16/438,121, filed on Jun. 11, 2019, now Pat. No. 10,756,697, which is a continuation-in-part of application No. 16/230,443, filed on Dec. 21, 2018, now Pat. No. 10,491,192.

(60) Provisional application No. 62/904,416, filed on Sep. 23, 2019, provisional application No. 62/881,749, filed on Aug. 1, 2019, provisional application No. 62/830,258, filed on Apr. 5, 2019, provisional application No. 62/753,815, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
  *H03H 9/10* (2006.01)
  *H03H 9/58* (2006.01)
  *H03H 9/64* (2006.01)

(52) U.S. Cl.
  CPC .......... *H03H 9/105* (2013.01); *H03H 9/1085* (2013.01); *H03H 9/586* (2013.01); *H03H 9/6406* (2013.01)

(58) Field of Classification Search
  USPC ........................................................ 333/193
  See application file for complete search history.

(56) References Cited

U.S. PATENT DOCUMENTS

| | | |
|---|---|---|
| 5,631,515 A | 5/1997 | Mineyoshi et al. |
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,939,987 B1 | 5/2011 | Solal et al. |
| 7,941,103 B2 | 5/2011 | Iwamoto et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,391 B2 | 8/2019 | Ito et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,512 B2 | 12/2020 | Garcia et al. |
| 10,917,070 B2 | 2/2021 | Plesski et al. |
| 10,985,728 B2 | 4/2021 | Plesski et al. |
| 10,992,282 B1 | 4/2021 | Plesski et al. |
| 11,146,232 B2 | 10/2021 | Yandrapalli et al. |
| 11,201,601 B2 | 12/2021 | Yantchev et al. |
| 11,323,089 B2 | 5/2022 | Turner |
| 11,418,167 B2 | 8/2022 | Garcia |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2002/0190814 A1 | 12/2002 | Yamada et al. |
| 2003/0080831 A1 | 5/2003 | Naumenko et al. |
| 2003/0128081 A1 | 7/2003 | Ella et al. |
| 2003/0199105 A1 | 10/2003 | Kub et al. |
| 2004/0041496 A1 | 3/2004 | Mai et al. |
| 2004/0100164 A1 | 5/2004 | Murata |
| 2004/0207033 A1 | 10/2004 | Koshido |
| 2004/0207059 A1 | 10/2004 | Hong |
| 2004/0207485 A1 | 10/2004 | Kawachi et al. |
| 2004/0209387 A1 | 10/2004 | Hong |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0131731 A1 | 6/2006 | Sato |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0296304 A1 | 12/2007 | Fujii et al. |
| 2008/0018414 A1 | 1/2008 | Inoue et al. |
| 2008/0169884 A1 | 7/2008 | Matsumoto et al. |
| 2008/0246559 A1 | 10/2008 | Ayazi |
| 2008/0297280 A1 | 12/2008 | Thalhammer et al. |
| 2009/0315640 A1 | 12/2009 | Umeda et al. |
| 2010/0064492 A1 | 3/2010 | Tanaka |
| 2010/0102669 A1 | 4/2010 | Yamanaka |
| 2010/0123367 A1 | 5/2010 | Tai et al. |
| 2010/0223999 A1 | 9/2010 | Onoe |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto |
| 2011/0199163 A1 | 8/2011 | Yamanaka |
| 2011/0278993 A1 | 11/2011 | Iwamoto |
| 2012/0181898 A1 | 7/2012 | Hatakeyama et al. |
| 2012/0286900 A1 | 11/2012 | Kadota et al. |
| 2013/0057360 A1 | 3/2013 | Meltaus et al. |
| 2013/0207747 A1 | 8/2013 | Nishii et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0113571 A1 | 4/2014 | Fujiwara et al. |
| 2014/0130319 A1 | 5/2014 | Iwamoto |
| 2014/0145556 A1 | 5/2014 | Kadota |

(56) References Cited

U.S. PATENT DOCUMENTS

| | | |
|---|---|---|
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0014795 A1 | 1/2015 | Franosch et al. |
| 2015/0042417 A1 | 2/2015 | Onodera et al. |
| 2015/0244149 A1 | 8/2015 | Van Someren |
| 2015/0319537 A1 | 11/2015 | Perois et al. |
| 2015/0333730 A1 | 11/2015 | Meltaus |
| 2016/0028367 A1 | 1/2016 | Shealy |
| 2016/0049920 A1 | 2/2016 | Kishino |
| 2016/0079958 A1 | 3/2016 | Burak |
| 2016/0149554 A1 | 5/2016 | Nakagawa |
| 2016/0182009 A1 | 6/2016 | Bhattacharjee |
| 2016/0285430 A1 | 9/2016 | Kikuchi et al. |
| 2016/0301382 A1 | 10/2016 | Iwamoto |
| 2017/0063332 A1 | 3/2017 | Gilbert et al. |
| 2017/0104470 A1 | 4/2017 | Koelle et al. |
| 2017/0179928 A1 | 6/2017 | Raihn et al. |
| 2017/0187352 A1 | 6/2017 | Omura |
| 2017/0201232 A1 | 7/2017 | Nakamura et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0290160 A1 | 10/2017 | Takano et al. |
| 2017/0370791 A1 | 12/2017 | Nakamura et al. |
| 2018/0005950 A1 | 1/2018 | Watanabe |
| 2018/0013400 A1 | 1/2018 | Ito et al. |
| 2018/0013405 A1 | 1/2018 | Takata |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0097502 A1 | 4/2018 | Yamamoto et al. |
| 2018/0123016 A1 | 5/2018 | Gong |
| 2018/0152169 A1 | 5/2018 | Goto et al. |
| 2018/0191322 A1 | 7/2018 | Chang et al. |
| 2018/0212589 A1 | 7/2018 | Meltaus et al. |
| 2018/0275485 A1 | 9/2018 | Hurwitz |
| 2018/0309426 A1 | 10/2018 | Guenard et al. |
| 2018/0316333 A1 | 11/2018 | Nakamura et al. |
| 2019/0007022 A1 | 1/2019 | Goto et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin |
| 2019/0348966 A1 | 11/2019 | Campanella-Pineda |
| 2019/0386633 A1 | 12/2019 | Plesski |
| 2019/0386638 A1 | 12/2019 | Kimura et al. |
| 2020/0007110 A1 | 1/2020 | Konaka et al. |
| 2020/0021271 A1 | 1/2020 | Plesski |
| 2020/0021272 A1 | 1/2020 | Segovia Fernandez et al. |
| 2020/0036357 A1 | 1/2020 | Mimura |
| 2020/0228087 A1 | 7/2020 | Michigami et al. |
| 2020/0235719 A1 | 7/2020 | Yantchev et al. |
| 2020/0244247 A1 | 7/2020 | Maeda |
| 2020/0274520 A1 | 8/2020 | Shin et al. |
| 2020/0295729 A1 | 9/2020 | Yantchev |
| 2020/0304091 A1 | 9/2020 | Yantchev |
| 2020/0321939 A1 | 10/2020 | Turner et al. |
| 2020/0328728 A1 | 10/2020 | Nakagawa et al. |
| 2021/0006228 A1 | 1/2021 | Garcia |
| 2021/0044277 A1* | 2/2021 | Turner ............... H03H 9/1085 |
| 2021/0119595 A1 | 4/2021 | Turner et al. |
| 2021/0273631 A1 | 9/2021 | Jachowski et al. |
| 2021/0313951 A1 | 10/2021 | Yandrapalli et al. |
| 2021/0328575 A1 | 10/2021 | Hammond et al. |
| 2022/0103160 A1 | 3/2022 | Jachowski et al. |
| 2022/0116014 A1 | 4/2022 | Poirel |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| CN | 210431367 U | 4/2020 |
| CN | 113765495 A | 12/2021 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010062816 A | 3/2010 |
| JP | 2010103803 A | 5/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2018093487 A | 6/2018 |
| JP | 2018166259 A | 10/2018 |
| JP | 2018207144 A | 12/2018 |
| JP | 2020113939 A | 7/2020 |
| WO | 2010047114 A1 | 4/2010 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2016208428 A1 | 12/2016 |
| WO | 2017188342 A1 | 11/2017 |
| WO | 2018003273 A1 | 1/2018 |
| WO | 2018163860 A1 | 9/2018 |
| WO | 2019138810 A1 | 7/2019 |
| WO | 2020092414 A2 | 5/2020 |
| WO | 2020100744 A1 | 5/2020 |

OTHER PUBLICATIONS

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) 00 Jan. 2015.

Zou, Jie "High-Performance Aluminum Nitride Lamb Wave Resonators for RF Front-End Technology" University of California, Berkeley, Summer 2015, pp. 63 (Year 2015) 00 Jan. 2015.

Santosh, G., Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreynl, B. Fabrication and Design of Resonant Microdevices Andrew William, Inc. 2018, NY (Year 2008). 2008.

Material Properties of Tibtech Innovations, © 2018 TIBTECH Innovations (Year 2018). 2018.

(56) References Cited

OTHER PUBLICATIONS

Namdeo et al. "Simulation on Effects of Electrical Loading due to Interdigital Transducers in Surface Acoustic Wave Resonator", published in Procedia Engineering 64 (2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 Ghz Lithium Niobate Mems Resonators With High Fom Of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi: 10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Lam et al., "A Review of Lamé and Lamb Mode Crystal Resonators for Timing Applications and Prospects of Lamé and Lamb Mode Piezo MEMS Resonators for Filtering Applications," 2018 International Symposium on Acoustic Wave Devices for Future Mobile Communication Systems, Mar. 6-7, 2018, 12 pages.

Abass et al., "Effects of inhomogeneous grain size distribution in polycrystalline silicon solar cells," Energy Procedia, 2011, vol. 10, pp. 55-60.

Gnewuch et al., "Broadband monolithic acousto-optic tunable filter," Optics Letters, Mar. 2000, vol. 25, No. 5, pp. 305-307.

Gorisse et al., "Lateral Field Excitation of membrane-based Aluminum Nitride resonators," 2011 Joint Conference of the IEEE International Frequency Control and the European Frequency and Time Forum (FCS) Proceedings, 2011, 5 pages.

Kadota et al., "Ultra Wideband Ladder Filter Using SH0 Plate Wave in Thin LiNbO3 Plate and Its Application to Tunable Filter," IEEE Transactions on Ultrasonics, Ferroelectrics, and Frequency Control, 2015, vol. 62, No. 5, pp. 939-946.

Pang et al., "Self-Aligned Lateral Field Excitation Film Acoustic Resonator with Very Large Electromechanical Coupling," 2004 IEEE International Ultrasonics, Ferroelectrics and Frequency Control Joint 50th Anniversary Conference, 2004, pp. 558-561.

Reinhardt et al., "Acoustic filters based on thin single crystal LiNbO3 films: status and prospects," IEEE International Ultrasonics Symposium, Sep. 2014, pp. 773-781.

Xue et al., High Q Lateral-Field-Excited Bulk Resonator Based on Single-Crystal LiTaO3 for 5G Wireless Communication, Journal of Electron Devices Society, Mar. 2021, vol. 9, pp. 353-358.

Yandrapalli et al., "Toward Band n78 Shear Bulk Acoustic Resonators Using Crystalline Y-Cut Lithium Niobate Films wit Spurious Suppression," Journal of Microelectromechanical Systems, Aug. 2023, vol. 32, No. 4, pp. 327-334.

* cited by examiner

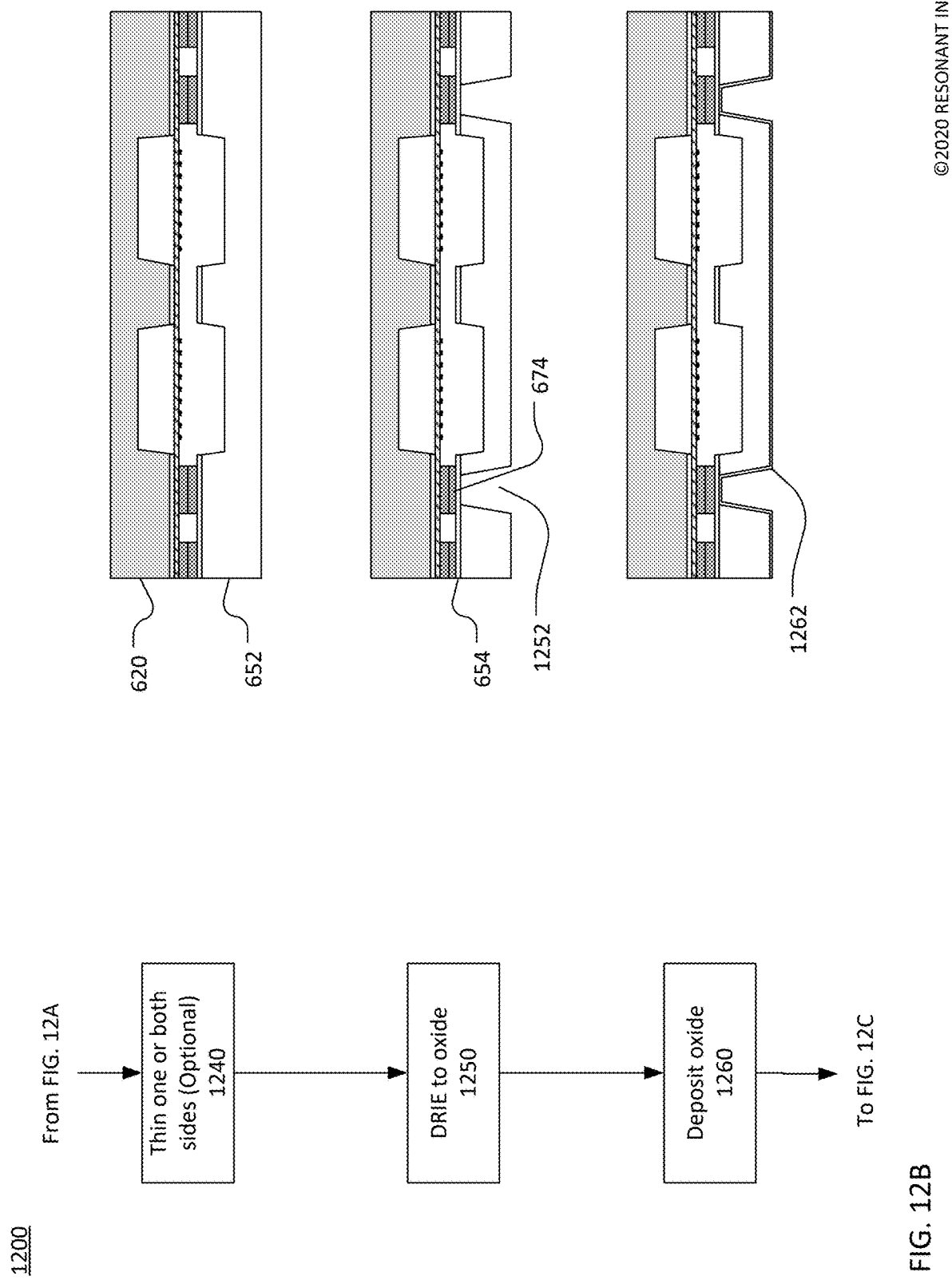

TRANSVERSELY-EXCITED FILM BULK ACOUSTIC RESONATOR PACKAGE

RELATED APPLICATION INFORMATION

The patent is a continuation-in-part of copending U.S. application Ser. No. 16/998,300 titled TRANSVERSELY-EXCITED FILM BULK ACOUSTIC RESONATOR, filed Aug. 20, 2020, which is a Divisional of U.S. application Ser. No. 16/841,134 titled TRANSVERSELY-EXCITED FILM BULK ACOUSTIC RESONATOR PACKAGE AND METHOD, filed Apr. 6, 2020, now U.S. Pat. No. 10,819,309 granted Oct. 27, 2020 which claims priority to the following provisional patent applications: application 62/830,258, titled XBAR PACKAGING, filed Apr. 5, 2019; application 62/881,749, titled XBAR PACKAGING INCLUDING CAP PLATE, filed Aug. 1, 2019; and application 62/904,416, titled XBAR WAFER-LEVEL PACKAGING, filed Sep. 23, 2019, all of which are incorporated herein by reference in their entirety.

This patent is a continuation-in-part of copending U.S. application Ser. No. 16/920,173 titled TRANSVERSELY-EXCITED FILM BULK ACOUSTIC RESONATOR, filed Jul. 2, 2020, which is a continuation of application Ser. No. 16/438,121 titled TRANSVERSELY-EXCITED FILM BULK ACOUSTIC RESONATOR, filed Jun. 11, 2019, Now U.S. Pat. No. 10,756,697, which is a continuation-in-part of application Ser. No. 16/230,443, entitled TRANSVERSELY-EXCITED FILM BULK ACOUSTIC RESONATOR, filed Dec. 21, 2018, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

This patent is related to application Ser. No. 17/067,418, filed Oct. 9, 2020, entitled TRANSVERSELY-EXCITED FILM BULK ACOUSTIC RESONATOR PACKAGE AND METHOD.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. These bands are not presently used. Future proposals for wireless communications include millimeter wave communication bands with frequencies up to 28 GHz.

For example, the peak speed for fourth generation ("4G") cellular service is typically 100 megabits per second for high mobility communication (such as from trains and cars) and 1 gigabit per second (Gbit/s) for low mobility communication (such as pedestrians and stationary users). However, the new fifth generation ("5G") networks will need to have greater bandwidth, giving higher download speeds, eventually up to 10-20 gigabits per second (Gbit/s).

In order to handle the increased bandwidth of 5G cellular service; and 5 GHz and 6 GHz WiFi, wide bandwidth filters will be needed for wireless frequencies above 3 GHz. For example, the 5G bands n77 and n79 use frequency bands at 3.3-4.2 GHz and 4.4-5.0 GHz, respectively. Thus, there will be a need for RF filters that not only operate at higher frequency but also have a much wider bandwidth than those currently available.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

DESCRIPTION OF THE DRAWINGS

FIG. 12A, FIG. 12B, and FIG. 12C are, in combination, a flow chart of process for packaging an XBAR filter.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
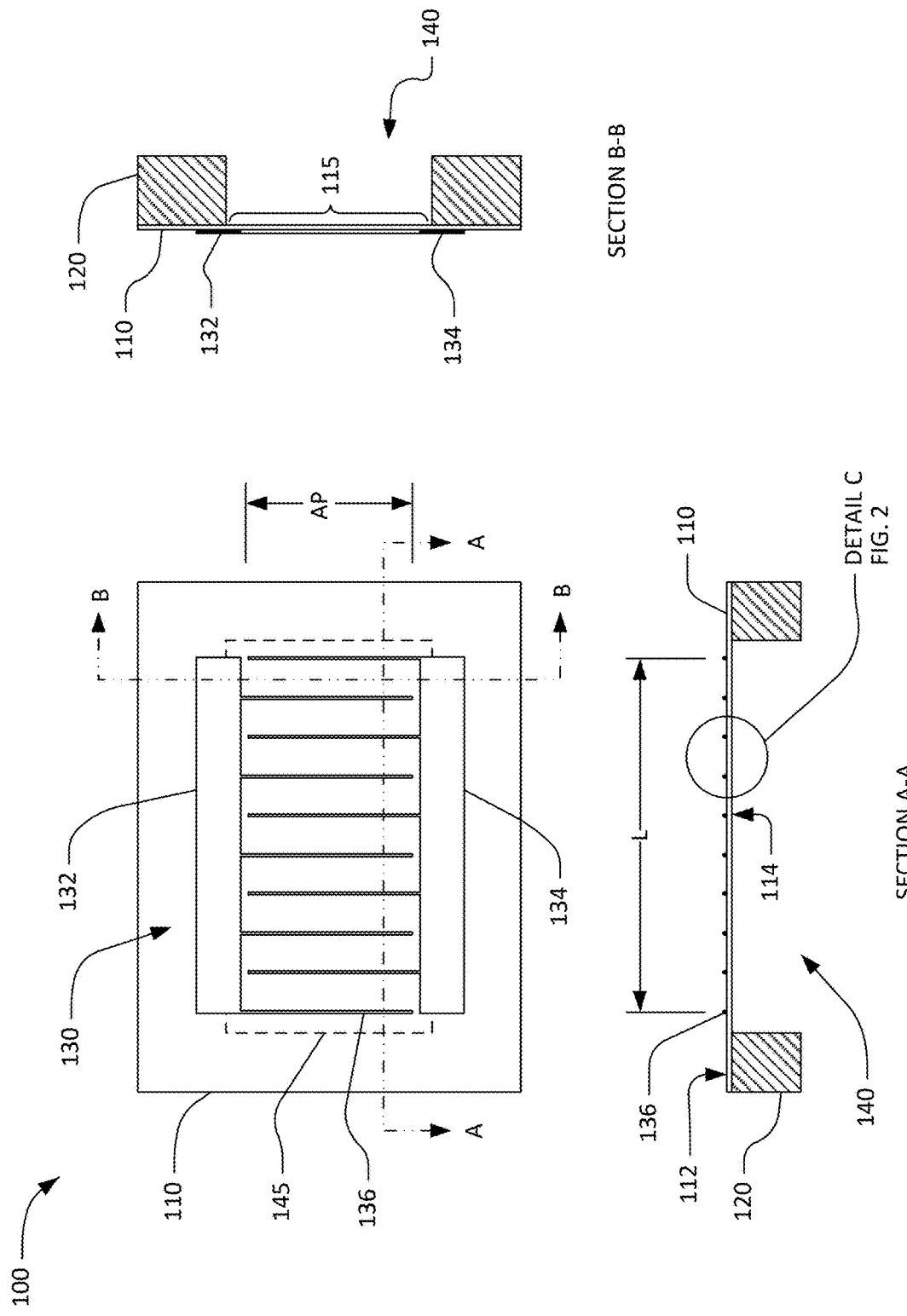
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The back surface 114 of the piezoelectric plate 110 may be bonded to the substrate 120 using a wafer bonding process, or grown on the substrate 120, or attached to the substrate in some other manner. The piezoelectric plate may be attached directly to the substrate, or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the excited primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3A). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm"

(for lack of a better term) due to its physical resemblance to the diaphragm of a microphone. The diaphragm may be continuously and seamlessly connected to the rest of the piezoelectric plate 110 around all, or nearly all, of perimeter of the cavity 140. In this context, "contiguous" means "continuously connected without any intervening item".

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
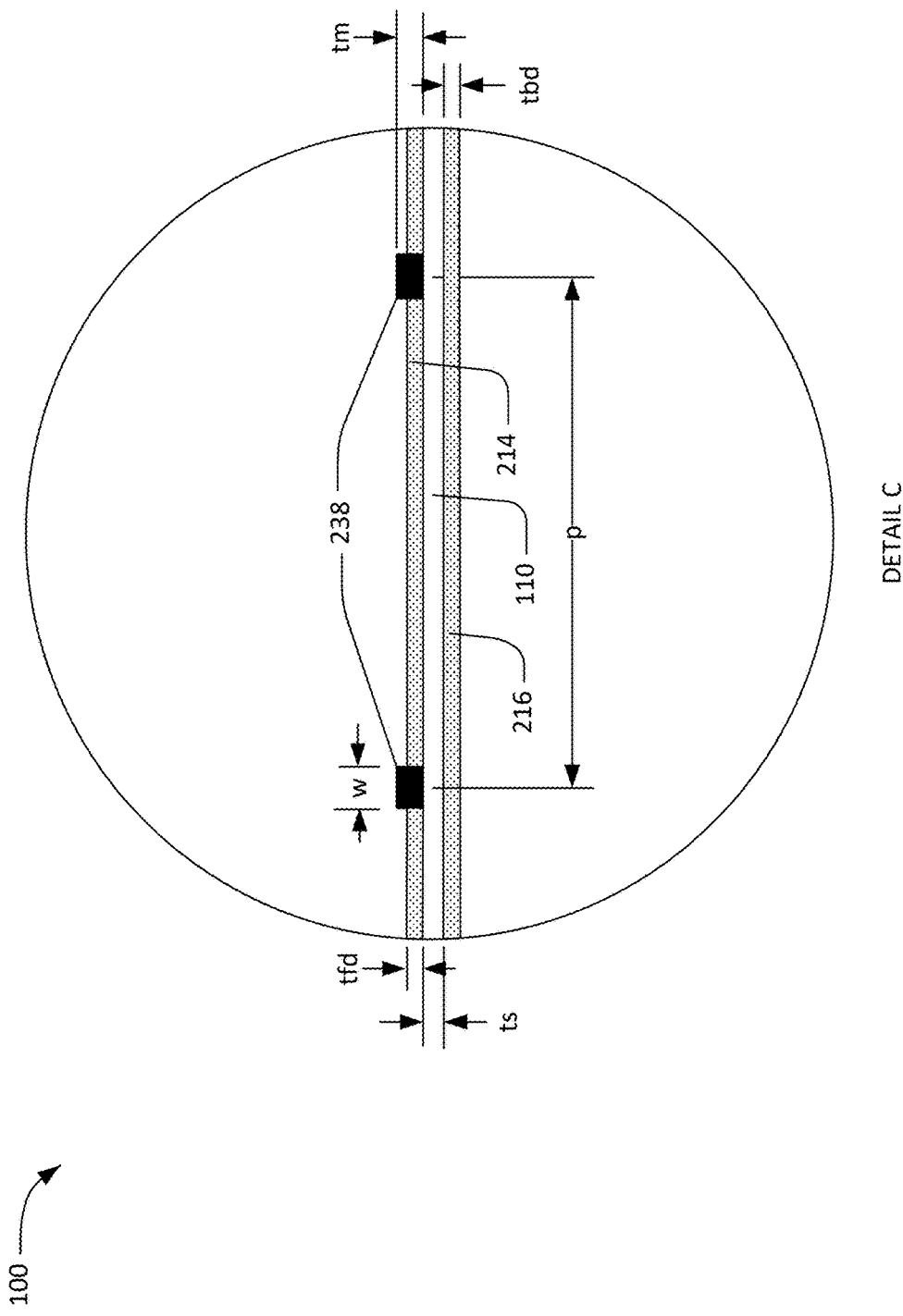
FIG. 2 is an expanded schematic cross-sectional view of a portion of the XBAR of FIG. 1.

FIG. 2 shows a detailed schematic cross-sectional view of the XBAR 100 of FIG. 1. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The front side dielectric layer 214 may be formed over the IDTs of some (e.g., selected ones) of the XBAR devices in a filter. The front side dielectric 214 may be formed between and cover the IDT finger of some XBAR devices but not be formed on other XBAR devices. For example, a front side dielectric layer may be formed over the IDTs of shunt resonators to lower the resonance frequencies of the shunt resonators with respect to the resonance frequencies of series resonators, which have thinner or no front side dielectric. Some filters may include two or more different thicknesses of front side dielectric over various resonators. The resonance frequency of the resonators can be set thus "tuning" the resonator, at least in part, by selecting a thicknesses of the front side dielectric.

Further, a passivation layer may be formed over the entire surface of the XBAR device 100 except for contact pads where electric connections are made to circuitry external to the XBAR device. The passivation layer is a thin dielectric layer intended to seal and protect the surfaces of the XBAR device while the XBAR device is incorporated into a package. The front side dielectric layer and/or the passivation layer may be, $SiO_2$, $Si_3N_4$, $Al_2O_3$, some other dielectric material, or a combination of these materials.

The thickness of the passivation layer may be selected to protect the piezoelectric plate and the metal electrodes from water and chemical corrosion, particularly for power durability purposes. It may range from 10 to 100 nm. The passivation material may consist of multiple oxide and/or nitride coatings such as $SiO_2$ and $Si_3N_4$ material.

The IDT fingers 238 may be aluminum or a substantially aluminum alloy, copper or a substantially copper alloy, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3A:
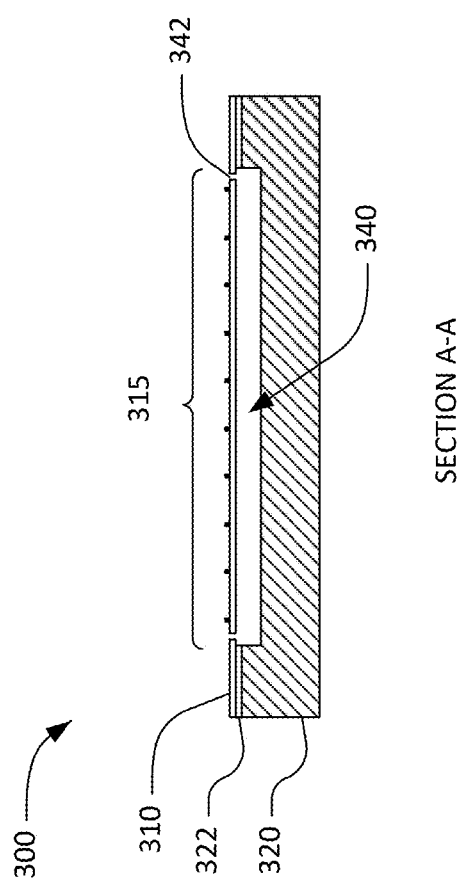
FIG. 3A is an alternative schematic cross-sectional view of the XBAR of FIG. 1.

FIG. 3A is an alternative cross-sectional view along the section plane A-A defined in FIG. 1. In FIG. 3A, a piezoelectric plate 310 is attached to a substrate 320. A portion of the piezoelectric plate 310 forms a diaphragm 315 spanning a cavity 340 in the substrate. The cavity 340, does not fully penetrate the substrate 320, and is formed in the substrate under the portion of the piezoelectric plate 310 containing the IDT of an XBAR. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 342 provided in the piezoelectric plate 310. In this case, the diaphragm 315 may be contiguous with the rest of the piezoelectric plate 310 around a large portion of a perimeter 345 of the cavity 340. For example, the diaphragm 315 may be contiguous with the rest of the piezoelectric plate 310 around at least 50% of the perimeter of the cavity 340.

The XBAR 300 shown in FIG. 3A will be referred to herein as a "front-side etch" configuration since the cavity 340 is etched from the front side of the substrate 320 (before or after attaching the piezoelectric plate 310). The XBAR 100 of FIG. 1 will be referred to herein as a "back-side etch" configuration since the cavity 140 is etched from the back side of the substrate 120 after attaching the piezoelectric plate 110.

The XBARs of FIG. 1 and FIG. 3A and filter devices using XBARs must be encased in a package. The package for an XBAR must perform the following functions:

Provide mechanical protection for the diaphragms and conductor patterns;

Provide cavities facing the diaphragms comparable to the cavity 340 in the substrate 320;

Provide a seal to prevent intrusion of humidity and/or fluids that may be encountered during subsequent assembly of the packaged filter into an electronic device; and Provide means for connecting the conductor patterns of the XBARs to circuitry external to the packaged filter device.

Figure 3B:
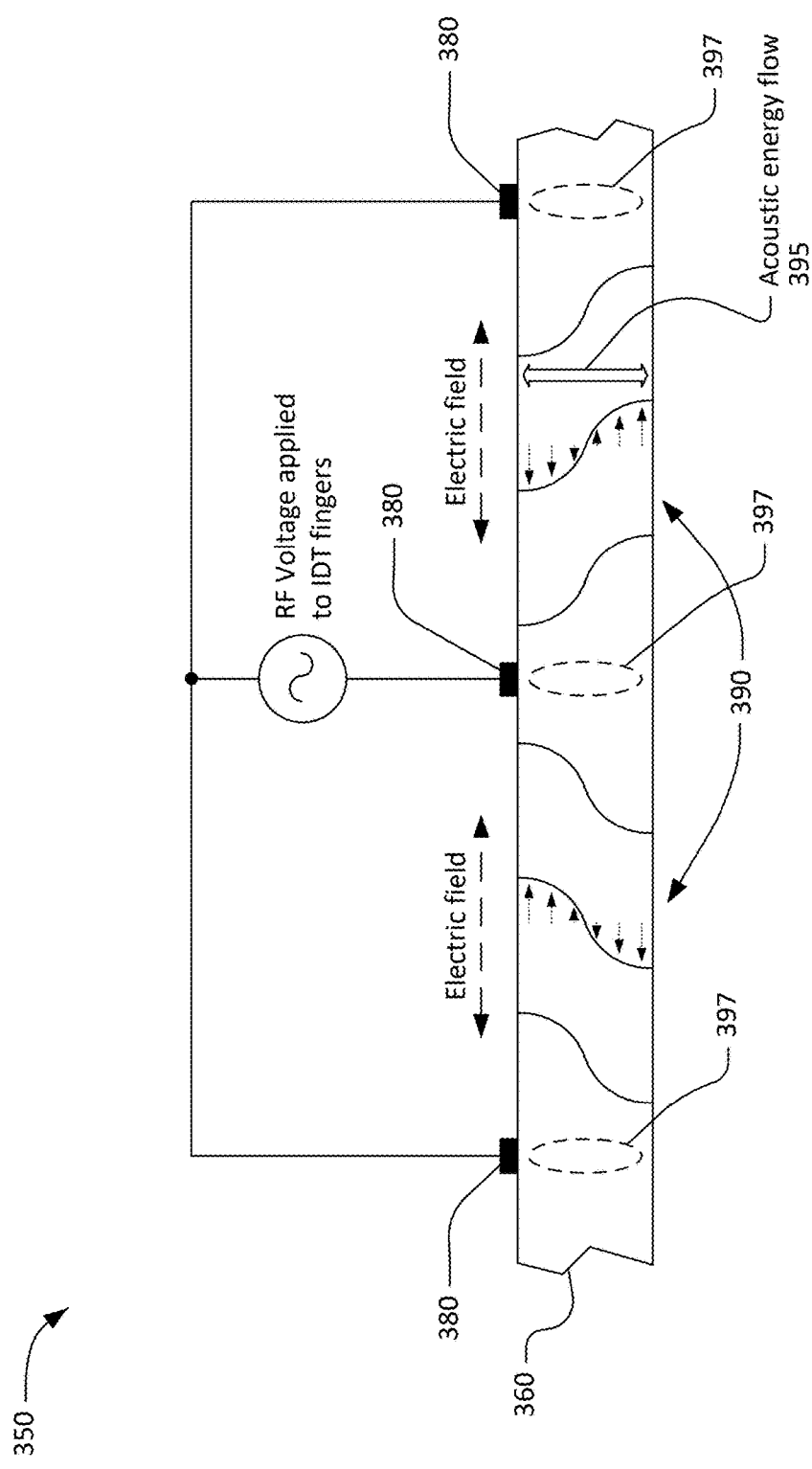
FIG. 3B is a graphic illustrating a shear horizontal acoustic mode in an XBAR.

FIG. 3B is a graphical illustration of the primary acoustic mode of interest in an XBAR. FIG. 3B shows a small portion of an XBAR 350 including a piezoelectric plate 360 and three interleaved IDT fingers 380. An RF voltage is applied to the interleaved fingers 380. This voltage creates a time-varying electric field between the fingers. The direction of the electric field is lateral, or parallel to the surface of the piezoelectric plate 360, as indicated by the arrows labeled "electric field". Due to the high dielectric constant of the piezoelectric plate, the electric field is highly concentrated in the plate relative to the air. The lateral electric field introduces shear deformation, and thus strongly excites a primary shear-mode acoustic mode, in the piezoelectric plate 360. In this context, "shear deformation" is defined as deformation in which parallel planes in a material remain parallel and maintain a constant distance while translating relative to each other. A "shear acoustic mode" is defined as an acoustic vibration mode in a medium that results in shear deformation of the medium. The shear deformations in the XBAR 350 are represented by the curves 390, with the adjacent small arrows providing a schematic indication of the direction and magnitude of atomic motion. The degree of atomic motion, as well as the thickness of the piezoelectric plate 360, have been greatly exaggerated for ease of visualization. While the atomic motions are predominantly lateral (i.e. horizontal as shown in FIG. 3B4), the direction of acoustic energy flow of the excited primary shear acoustic mode is substantially orthogonal to the front and back surface of the piezoelectric plate, as indicated by the arrow 395.

Considering FIG. 3B, there is essentially no electric field immediately under the IDT fingers 380, and thus acoustic modes are only minimally excited in the regions 397 under the fingers. There may be evanescent acoustic motions in these regions. Since acoustic vibrations are not excited under the IDT fingers 380, the acoustic energy coupled to the IDT fingers 380 is low (for example compared to the fingers of an IDT in a SAW resonator), which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 4A:
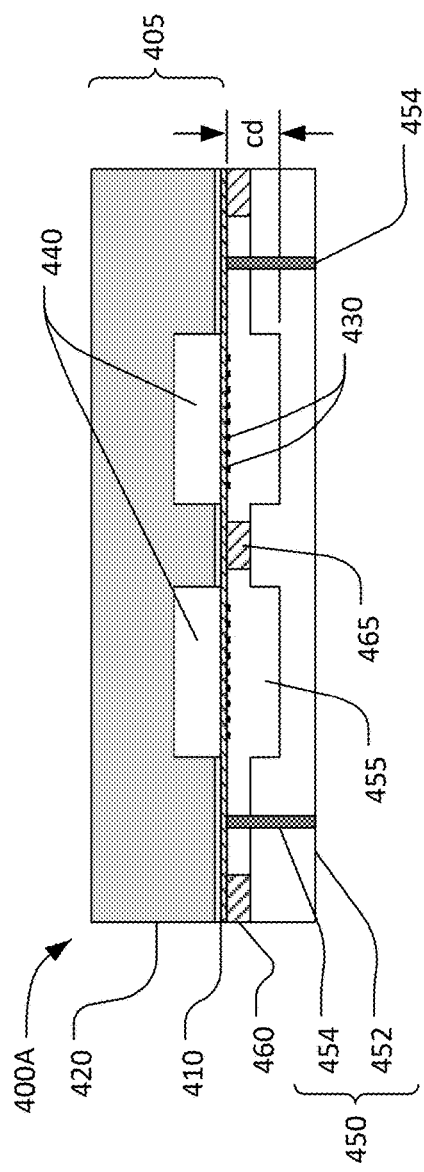
FIG. 4A is a schematic cross-sectional view of a packaged XBAR.
Figure 4B:
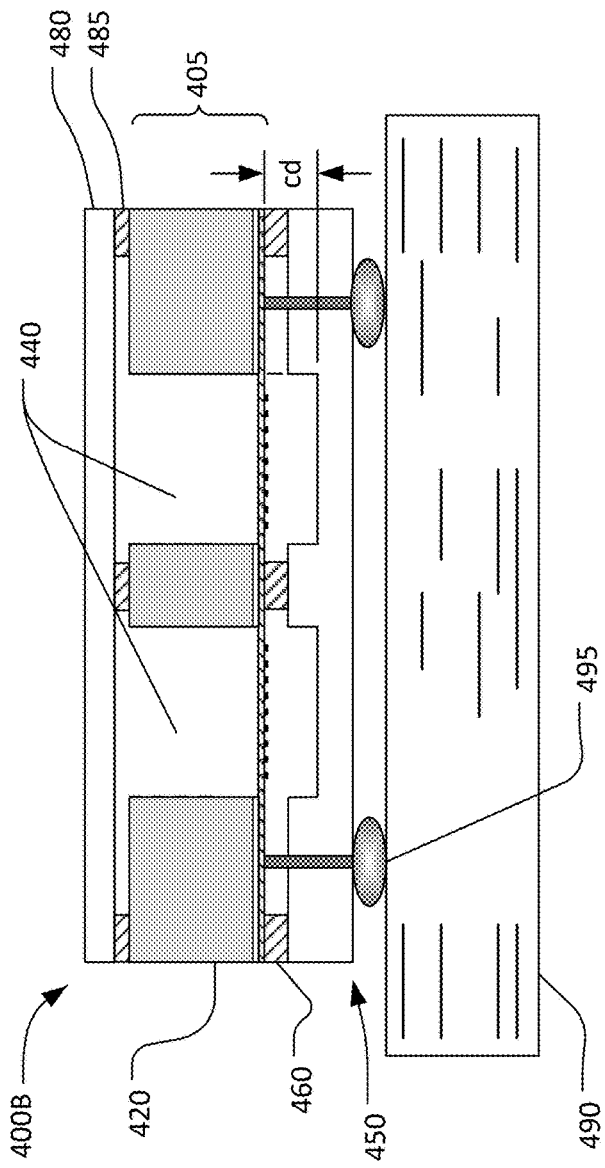
FIG. 4B is a schematic cross-sectional view of another packaged XBAR.

FIG. 4A and FIG. 4B are schematic cross-sectional views of packaged XBAR filters, each of which comprises an XBAR filter chip 405 and an interposer 450. While the cross-sectional views of FIG. 4A and FIG. 4B show the XBAR filter chips 405 containing two XBARs, filters may commonly include five to nine XBARs. Specifically, FIG. 4A is a schematic cross-sectional view of a packaged filter 400A using front-side etched XBARs, and FIG. 4B is a schematic cross-section view of a packaged XBAR filter 400B using back-side etched XBARs. FIG. 4A and FIG. 4B are intended to illustrate the requirements on the package for an XBAR filter but do not necessarily represent practical package structures.

Referring to FIG. 4A and FIG. 4B, the XBAR filter chip 405 includes a piezoelectric plate 410 attached to a substrate 420. Portions of the piezoelectric plate form diaphragms spanning respective cavities 440 in the substrate 420. Commonly, one or more intermediate layers, which are shown in FIG. 4A and FIG. 4B but not identified, may be disposed between the piezoelectric plate 410 and the substrate 420. Conductor patterns including IDTs are formed on the surface of the piezoelectric plate 410 such that interleaved IDT fingers, such as fingers 430, are disposed on the diaphragms.

The interposer 450 also includes a base 452 and conductive vias 454 to provide electrical connections between the conductor patters on the piezoelectric plate 410 and circuitry 490 external to the filter, such as using solder bumps 495. The term "interposer" is generally used to describe a passive circuit device that provides electrical connections between two different interfaces, such as contacts of the chip 405 and contacts of the circuitry 490. The interposer 450 fulfills this function but also forms a structural part of the package of the packaged XBAR filter 400A. The interposer may be, for example, a printed circuit board (PCB), a low temperature cofired ceramic (LTCC) circuit card, a silicon wafer, or some other structure that provides mechanical protection to the diaphragms of the XBARs.

In FIG. 4A, the conductive vias 454 are illustrated schematically as simple pins extending though the base to the piezoelectric plate. As will be discuss subsequently, physically realizable vias have more complex structures.

As shown in FIG. 4A, the interposer 450 includes recesses 455 facing the diaphragms of the XBARs. Such recesses may be required to ensure sufficient spacing between the diaphragms and the surfaces of the interposer facing the diaphragms (i.e. the bottom surfaces of the cavities 440). The required spacing (dimension cd in the FIG. 4A) depends on the material of the interposer.

Acoustic RF filters usually incorporate multiple acoustic resonators. Typically, these resonators have at least two different resonance frequencies. For example, an RF filter using the well-known "ladder" filter architecture includes shunt resonators and series resonators. A shunt resonator typically has a resonance frequency below the passband of the filter and an anti-resonance frequency within the passband. A series resonator typically has a resonance frequency within the pass band and an anti-resonance frequency above the passband. In many filters, each resonator has a unique resonance frequency. An ability to obtain different resonance frequencies for XBARs made on the same piezoelectric plate greatly simplifies the design and fabrication of RF filters using XBARs.

Figure 5A:
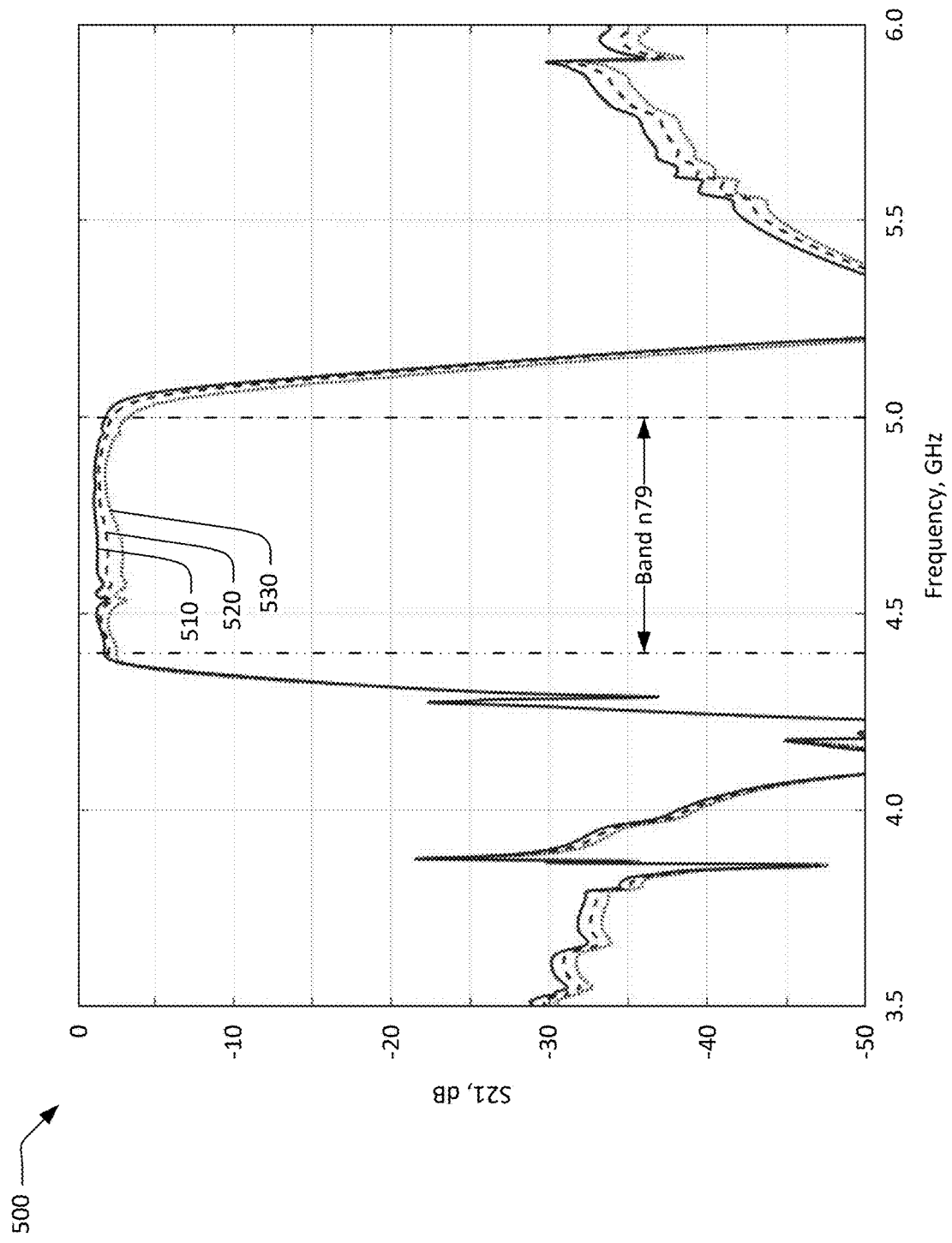
FIG. 5A is a graph of the transmission S21 through a bandpass filter using XBARs with a distance between the XBARs and a silicon cover as a parameter.

FIG. 5A is a plot of the transmission (S21) through a bandpass filter including five XBARs in a package including a base made from a high resistivity silicon wafer. The silicon wafer has high dielectric permittivity and finite conductivity that can distort the electric fields created by the IDTs within the XBARs and introduce electrical losses, and thus impact the filter performance. The solid line 510 is a plot of S12 for a filter where the dimension cd is 50 microns. The dashed line 520 is a plot of S12 for the same filter where the dimension cd is 15 microns. The dotted line 530 is a plot of S12 for the same filter where the dimension cd is 5 microns. Reducing the spacing between the surface of the interposer and the diaphragms from 50 microns to 15 microns reduces the transmission of the filter in the passband by about 0.5 dB. Further reducing the spacing between the surface of the interposer and the diaphragms to 5 microns results in an addition reduction in transmission by about 1.0 dB. 15 microns may be a practical minimum for the dimension cd. Increasing the spacing between the surface of the interposer beyond 50 microns, for example to 100 microns, may offer a small addition improvement in transmission. All transmission plots are based on simulations of packaged filters using finite element methods.

Figure 5B:
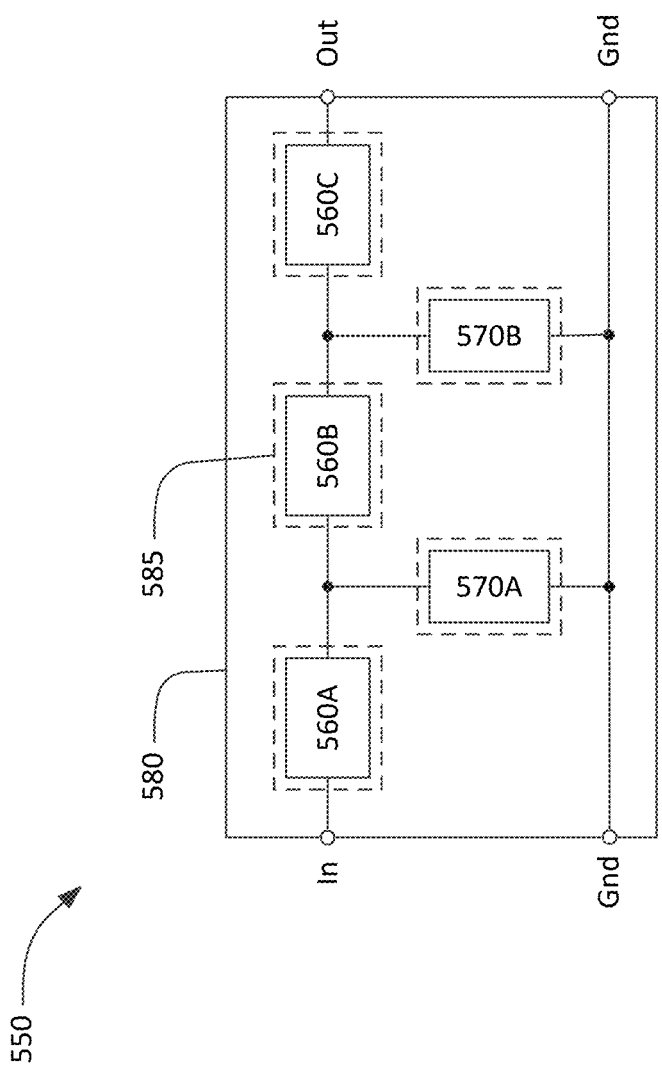
FIG. 5B is a schematic block diagram of a filter using XBARs.

FIG. 5B is a schematic circuit diagram and layout for a high frequency band-pass filter 550 using XBARs. The filter 550 has a conventional ladder filter architecture including three series resonators 560A, 560B, 560C and two shunt resonators 570A, 570B. The three series resonators 560A, 560B, and 560C are connected in series between a first port and a second port. In FIG. 5B, the first and second ports are labeled "In" and "Out", respectively. However, the filter 550 is bidirectional and either port and serve as the input or output of the filter. The two shunt resonators 570A, 570B are connected from nodes between the series resonators to ground. All the shunt resonators and series resonators are XBARs.

The three series resonators 560A, B, C and the two shunt resonators 570A, B of the filter 550 are formed on a single plate 580 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5B, the cavities are illustrated schematically as the dashed rectangles (such as the rectangle 585). In this example, each IDT is disposed over a respective cavity. In other filters, the IDTs of two or more resonators may be disposed over a single cavity.

In some cases, the IDTs include at least five IDTs, each IDT having a recess in the interposer facing the diaphragm and a distance from a bottom of the recess to the diaphragm that is greater than or equal to 15 microns and less than or equal to 100 microns. The first conductor pattern includes electrical connections that connect the shunt resonators and the series resonators in a bandpass ladder filter architecture, such as shown in FIG. 5B.

Two or more portions of the piezoelectric plate each may form at least two diaphragms, each diaphragm having an IDT and spanning a respective cavity. In some cases, the two or more portions of the piezoelectric plate are portions of a single piezoelectric plate that spans all of the cavities. In other cases, the two or more portions of the piezoelectric plate are two separate pieces of piezoelectric plate and are separated by an etched trench through the piezoelectric plate. Here, the trench may be etched by patterning all of the plate except where trenches are desired between and to separate or dice each diaphragm from all others. This may be done prior to or after mounting the plate(s) on the substrate. The patterning may use a photoresist as described herein. The etch may be a wet or dry etch such as an etch used to etch the conductor material as described herein.

Referring back to FIG. 4A, the interposer 450 is attached to the piezoelectric plate 410 by a seal 460. The seal 460 provides mechanical attachment and prevents intrusion of humidity and other fluids into the interior of the packaged XBAR filter 400A. As shown in FIG. 4A, the seal 460 is a distinct structure having a finite thickness which contributes to the total spacing cd between the diaphragms and the facing surfaces of the interposer 450. The seal 460 may be, for example, a thermocompression or ultrasonic bond between metal layers deposited on the piezoelectric plate and the interposer, a polymer or adhesive bond, a eutectic or solder bond, a glass frit bond, or some other bonding method and structure. Alternatively, the seal may be a bond, such as a plasma activated or surface activated wafer bond, directly between the interposer 450 and the piezoelectric plate 410. In this case (not shown in FIG. 4A), the thickness of the seal 460 may be negligible. In all cases, the seal 460 is present around the entire perimeter of the packaged XBAR filter 400A. In addition, the same sealing mechanism may attach the piezoelectric plate 410 to the interposer 450 at locations, such as location 465, in the interior of the packaged XBAR filter 400A.

FIG. 4B is a schematic cross-section view of a packaged XBAR filter 400B using back-side etched XBARs. Except for the depth of the cavities 440, the structure of the XBAR filter chip 405, the interposer 450, and the seal 460 between the interposer and the piezoelectric plate are identical to the comparable elements in FIG. 4A. The descriptions of these elements will not be repeated.

In addition, the package XBAR filter 400B includes a cap 480 attached to the substrate 420 by a cap seal 485. The cap 480 may be any material suitable to cover the openings where the cavities 440 intersect the surface of the substrate 420. For example, the cap 480 may be silicon, glass, quartz, or a polymer plate or film. The cap seal 485 may be any of the materials and sealing methods previously described with respect to the seal 460.

FIG. 4B also illustrates the packaged XBAR filter 400B attached and electrically connected to a radio module circuit board 490 by means of solder balls 495. This is an example of the use of the packaged filter device. The radio module circuit board 490 and the solder balls 495 are not part of the filter device 400B.

Figure 6A:
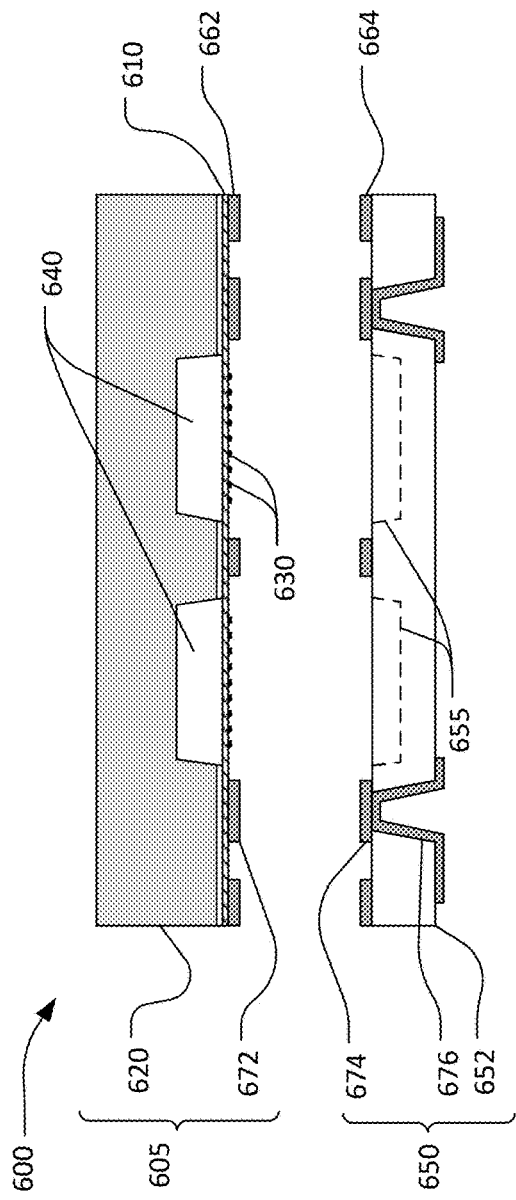
FIG. 6A is a schematic cross-sectional view of an XBAR filter chip and an interposer prior to bonding.

FIG. 6A is an exploded schematic cross-sectional view of a packaged XBAR filter 600. More specifically, FIG. 6A shows schematic cross-sectional views of an XBAR filter chip 605 including front-side etched XBARs and an interposer 650 prior to bonding.

The XBAR filter chip 605 includes a piezoelectric plate 610 attached to a substrate 620. The substrate 620 may be high resistivity silicon or some other material. Portions of the piezoelectric plate 610 form diaphragms spanning respective cavities 640 in the substrate 620. Commonly, one or more intermediate layers, which are shown in FIG. 6A but not identified, may be disposed between the piezoelectric plate 610 and the substrate 620. A first conductor pattern is formed on the surface of the piezoelectric plate 610. The first conductor pattern includes IDTs with interleaved IDT fingers, such as fingers 630, disposed on the diaphragms. The first conductor pattern may be aluminum, copper, molybdenum, or some other metal with a thickness of about 100 nm to 1000 nm.

A second conductor pattern is formed on the surface of the piezoelectric plate 610. The second conductor pattern, which may overlay portions of the first conductor pattern, may be gold, aluminum, copper or some other metal. The second conductor pattern includes a continuous metal ring 662 around the perimeter of the XBAR filter chip 605. The second conductor pattern also includes pads, such as pad 672, in locations where portions of the first conductor pattern must be connected to circuitry external to the packaged XBAR filter.

The interposer 650 includes a base 652, which may be high resistivity silicon or some other material. The base 652 may have recesses 655 so that the surfaces of the base 652 facing the diaphragms (i.e. the bottoms of the recesses 655) are sufficiently far from the diaphragms. A third conductor pattern is formed on the surface of the base 652 facing the XBAR filter chip 605. The third conductor pattern may be the same material as the second conductor pattern. The third conductor pattern includes a continuous metal ring 664 around the perimeter of the base 652. The third conductor pattern also includes pads, such as pad 674, in locations where portions of the first conductor pattern must be connected to circuitry external to the packaged XBAR filter. The arrangement of ring 664 and pads 674 of third conductor pattern is typically a mirror image of the arrangement of the ring 662 and pads 672 of the second conductor pattern. Pads that are arranged in a mirror image may be described as respective, matching or opposing pads of the two conductive patterns.

The interposer 650 also includes vias such as via 676. When the base is silicon, such vias are commonly referred to as "through silicon vias" (TSVs). Vias consist of a metal-coated or metal-filled hole through the base 652. Each via provides an electrical connection between one of the pads, such as pad 674, of the third conductor pattern and a corresponding pad on the external surface (i.e. the lower surface as shown in the figure) of the base 652. While FIG. 6A, which is intended to illustrate the structure of the packaged XBAR filter 600, shows the TSVs formed prior to bonding the XBAR filter chip 605 and the interposer 650, the vias may be formed after bonding.

Figure 6B:
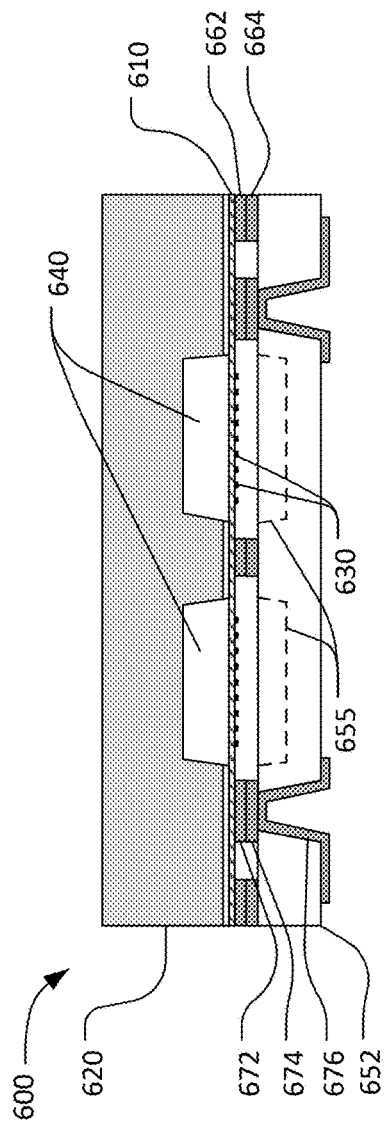
FIG. 6B is a schematic cross-sectional view of a packaged XBAR filter.

FIG. 6B is a schematic cross-sectional view of the packaged XBAR filter 600 after the XBAR filter chip 605 and the interposer 650 of FIG. 6A are bonded to each other. Descriptions of all of the identified elements in FIG. 6B were previously provided in the discussion of FIG. 6A and will not be repeated.

As shown in FIG. 6B, the ring 662 around the perimeter of the XBAR filter chip 605 has been directly bonded to the ring 664 around the perimeter of the interposer 650 to create a hermetic seal around the perimeter of the package XBAR filter 600. In this context, the term "directly bonded" means bonded without any intervening adhesive. Simultaneously, the pads, such as pad 672, of the second conductor pattern have been directly bonded to the pads, such as pad 674, of the third conductor pattern to create electrical connections between the XBAR filter chip 605 and the interposer 650. The bonds between the rings and pads of the second and third conductor patterns may be accomplished by, for example, thermocompression bonding or ultrasonic bonding.

Figure 7A:
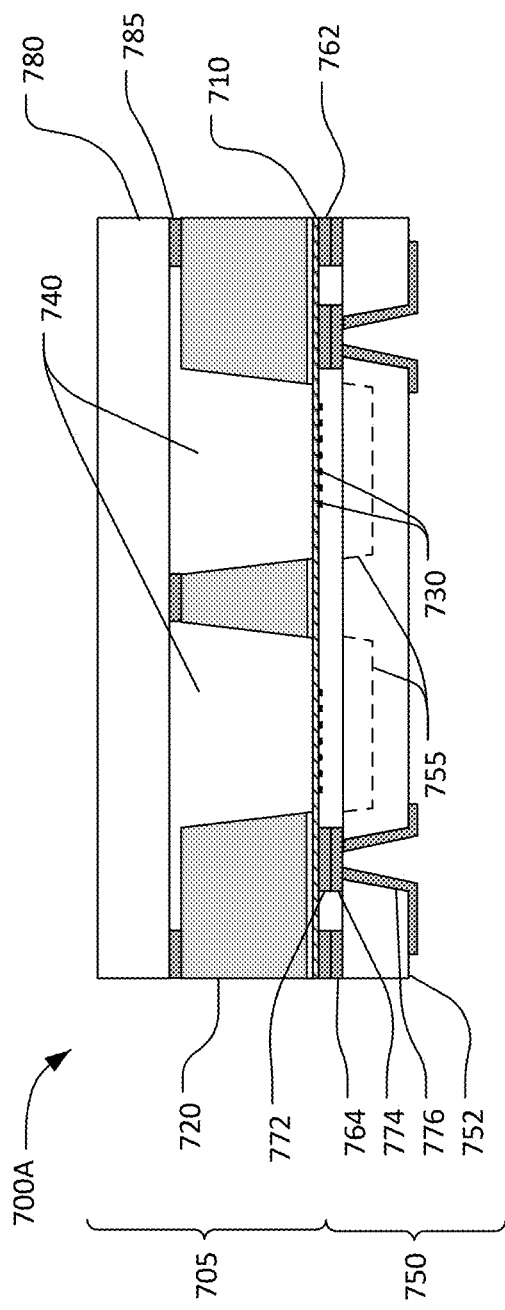
FIG. 7A is a schematic cross-sectional view of another packaged XBAR filter.

FIG. 7A is a schematic cross-sectional view of a packaged XBAR filter 700A including an XBAR filter chip 705 bonded to an interposer 750. With the exception of elements 780 and 785, the identified elements in FIG. 7A have the structure and function as the corresponding elements of FIG. 6A and FIG. 6B. Descriptions of these elements will not be repeated.

A cap 780 is sealed to the substrate 720 by a cap seal 785. When the substrate 720 of the XBAR filter chip 705 and the base 752 of the interposer 750 are both silicon, the cap 780 may also be silicon to maintain consistency of thermal expansion coefficients. In other cases, the cap 780 may be silicon, borosilicate or other glass, plastic, or some other material. The cap 780 may be attached to the substrate 720 using any of the previously described sealing methods and materials. Typically, the cap 780 will be attached to the substrate 720 immediately after forming the cavities 740 in the substrate. The cap 780 may be attached to the substrate 720 before bonding the XBAR filter chip 705 to the interposer 750.

Figure 7B:
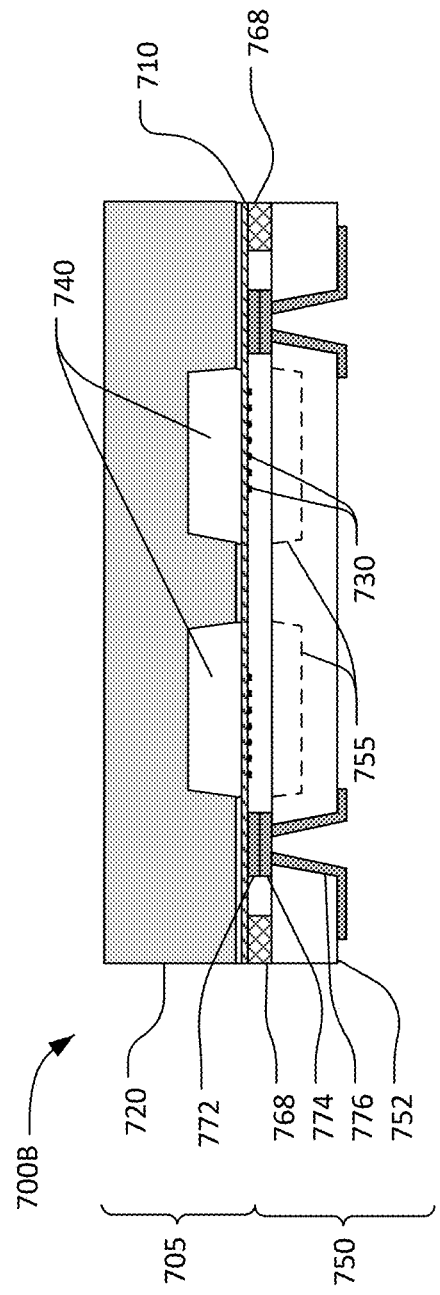
FIG. 7B is a schematic cross-sectional view of another packaged XBAR filter.

FIG. 7B is a schematic cross-sectional view of a packaged XBAR filter 700B including an XBAR filter chip 705 bonded to an interposer 750. With the exception of element 768, the identified elements in FIG. 7B have the structure and function as the corresponding elements of FIG. 6A and FIG. 6B. Descriptions of these elements will not be repeated.

In the packaged XBAR filter 700B, a perimeter seal between the piezoelectric plate 710 and the base 752 is not made by bonding conductor rings (i.e. conductor rings 762, 772 in FIG. 7A). Instead, a ring of cured adhesive material 768 forms a perimeter seal between the piezoelectric plate 710 and the base 752. The cured adhesive material 768 may be, for example, an epoxy resin or other thermosetting adhesive. The adhesive material (in an uncured state) may be applied to either or both of the piezoelectric plate 710 and the base 752 before the piezoelectric plate 710 and the base 752 are assembled. The adhesive material may be cured after or concurrent with bonding the pads 772 to the pads 774.

The XBAR filter chips 605 and 705 shown in FIG. 6B, FIG. 7A, and FIG. 7B may be portions of large wafers containing many filter chips. Similarly, the interposers 650 and 750 may be portions of large wafers containing a corresponding number on interposers. An XBAR wafer and an interposer wafer may be bonded and individual packaged XBAR filters may be excised from the bonded wafers.

Figure 8:
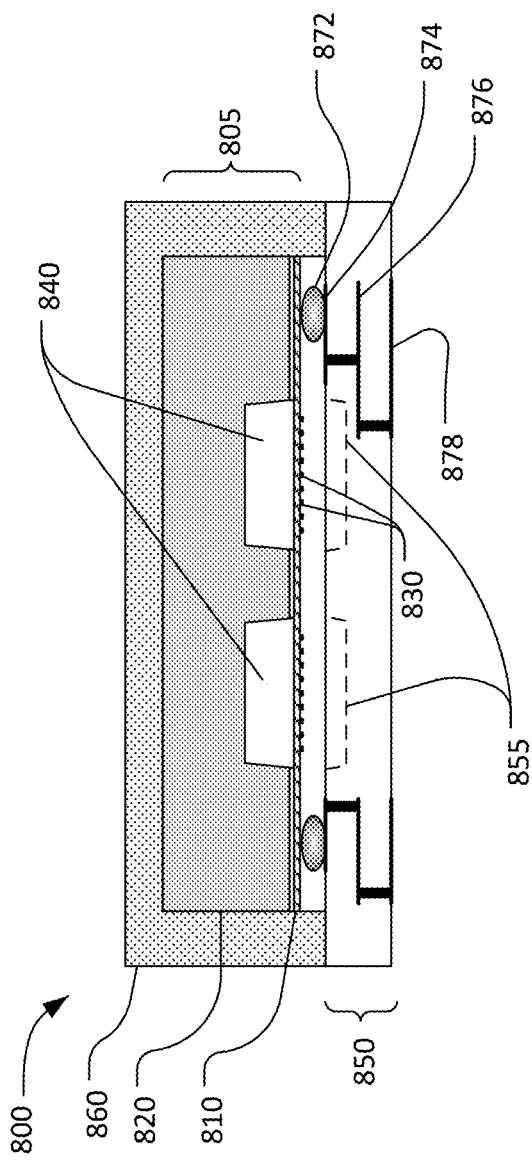
FIG. 8 is a schematic cross-sectional view of another packaged XBAR filter.

FIG. 8 is a schematic cross-sectional view of another packaged XBAR filter 800 including an XBAR filter chip 805 with front-side etched cavities 840 and a low temperature cofired ceramic (LTCC) interposer 850. As in the previous examples, the XBAR filter chip 805 includes a piezoelectric plate 810 attached to a substrate 820. The substrate 820 may be high resistivity silicon or some other material. Portions of the piezoelectric plate 810 form diaphragms spanning respective cavities 840 in the substrate 820. Commonly, one or more intermediate layers, which are shown in FIG. 8 but not identified, may be disposed between the piezoelectric plate 810 and the substrate 820. A conductor pattern is formed on the surface of the piezoelectric plate 810. The conductor pattern includes IDTs with interleaved IDT fingers, such as fingers 830, disposed on the diaphragms.

The LTCC interposer 850 comprises layers of thin ceramic tape, some or all of which bear printed conductors, that are assembled and then fired to form a rigid multilayer circuit board. In the example of FIG. 8, the interposer has three conductor layers 874, 876, 878. An LTCC interposer for an XBAR filter may have more than three layers. The availability of multiple conductor layers allows incorporation of passive components, such as inductors, into the interposer. The interposer 850 may also have conductive vias similar to vias 454 extending through each layer to electrically connect contact pads formed on the interposer back surface to contact pads formed on the interposer front surface. The conductive vias through one layer may be connected by the printed conductors to the vias through another layer. The conductive vias and printed conductors can connect the contact pads of the interposer back surface to contact pads formed on the interposer front surface.

The LTCC interposer 850 may have recesses 855 to ensure sufficient spacing between the diaphragms and the surfaces of the interposer facing the diaphragms. Such recess may be formed, for example, by punching openings in one or more of the ceramic layers prior to cofiring the layers of the interposer.

The XBAR filter chip 805 is flip-chip mounted to the interposer 850. Flip-chip mounting establishes physical and electric connections between the XBAR filter chip 805 and the interposer 850. As shown in FIG. 8, the connections are made by means of solder balls such as solder ball 872. Alternatively, the connections made be made by thermo-compression or ultrasonic bonding of gold bumps on the XBAR filter chip 805 and the interposer 850 (not shown).

Since flip-chip mounting does not establish a seal between the XBAR filter chip 805 and the interposer 850, a polymer cover 860 is molded over the assembly to provide a near-hermetic seal.

Figure 9:
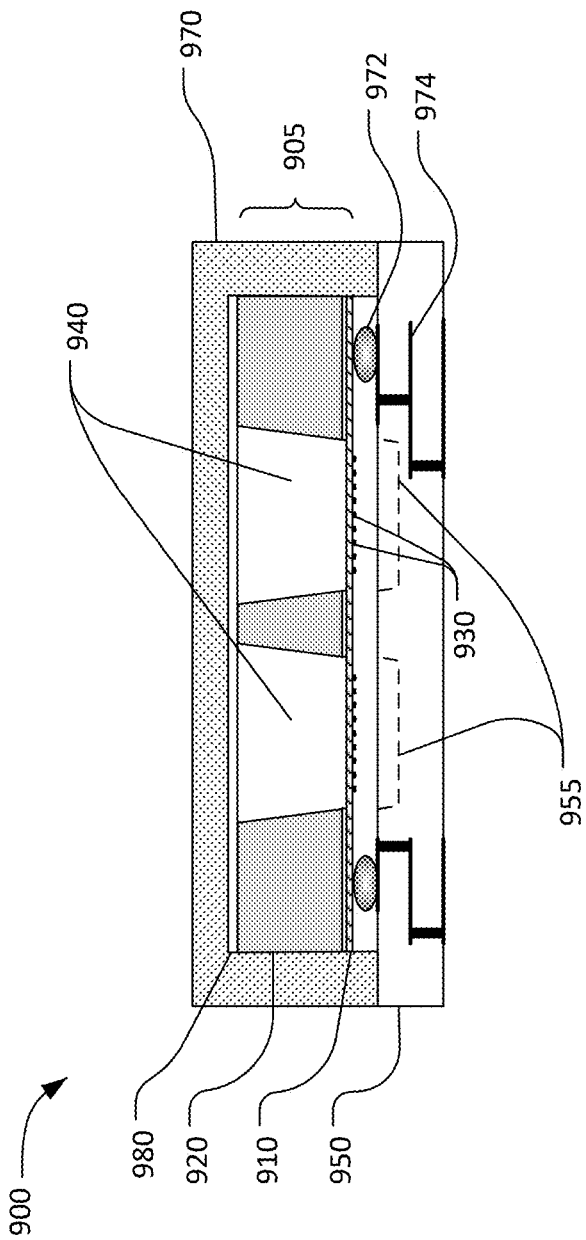
FIG. 9 is a schematic cross-sectional view of another packaged XBAR filter.

FIG. 9 is a schematic cross-sectional view of another packaged XBAR filter 900 including an XBAR filter chip 905 with back-side etched cavities and a low temperature cofired ceramic (LTCC) interposer 950. With the exception of element 980, the identified elements in FIG. 9 have the structure and function as the corresponding elements of FIG. 8. Descriptions of these elements will not be repeated.

A cap 980 is sealed to the substrate 920. Since the cap 980 is eventually enclosed by the molded cover 970, the cap's primary function is to prevent intrusion of materials, including the molding compound used for the cover 970, into the cavities 940. This function may be satisfied by a very thin cap, such as a plastic film.

Figure 10:
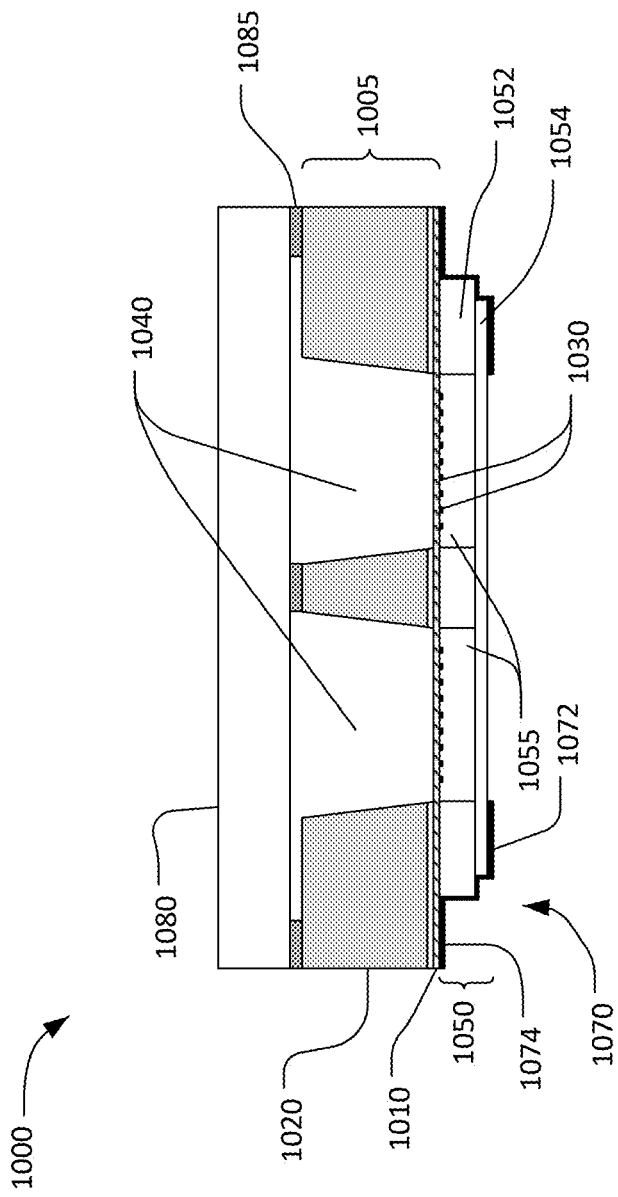
FIG. 10 is a schematic cross-sectional view of another packaged XBAR filter.

FIG. 10 is a schematic cross-sectional view of another packaged XBAR filter 1000 including an XBAR filter chip 1005 with back-side etched cavities and an interposer 1050 formed by layers built up on the surface of the XBAR filter chip. The XBAR filter chip 1005 is a portion of a wafer (not shown) containing multiple XBAR filter chips. The build up of the interposer layers is done on all of the XBAR filter chips simultaneously. Individual packaged XBAR filters are then excised from the wafer.

As in previous examples, the XBAR filter chip 1005 includes a piezoelectric plate 1010 attached to a substrate 1020. The substrate 1020 may be high resistivity silicon or some other material. Portions of the piezoelectric plate 1010 form diaphragms spanning respective cavities 1040 in the substrate 1020. Commonly, one or more intermediate layers, which are shown in FIG. 10 but not identified, may be disposed between the piezoelectric plate 1010 and the substrate 1020. A conductor pattern is formed on the surface of the piezoelectric plate 1010. The conductor pattern includes IDTs with interleaved IDT fingers, such as fingers 1030, disposed on the diaphragms. A cap 1080 is sealed to the substrate 1020 by a cap seal 1085 as previously described.

The interposer 1050 includes at least three layers sequentially formed on the piezoelectric plate 1010. Walls 1052 surround the diaphragms of the XBAR devices. The thickness of the walls 1052 defines the distance between the diaphragms and a cover layer 1054 that spans the walls creating an enclosed cavity 1055 over each diaphragm. Both the walls 1052 and the cover layer 1054 may be polymer materials. An interposer conductor pattern 1070 includes pads 1072 on the external surface of the cover layer 1054 for connection to circuitry external to the packaged XBAR filter. The conductor pattern 1070 connects the pads 1072 to connection points 1074 on the XBAR filer chip 1005. The conductor pattern 1070 may be aluminum, copper, gold, or a combination of materials.

Description of Methods

Figure 11:
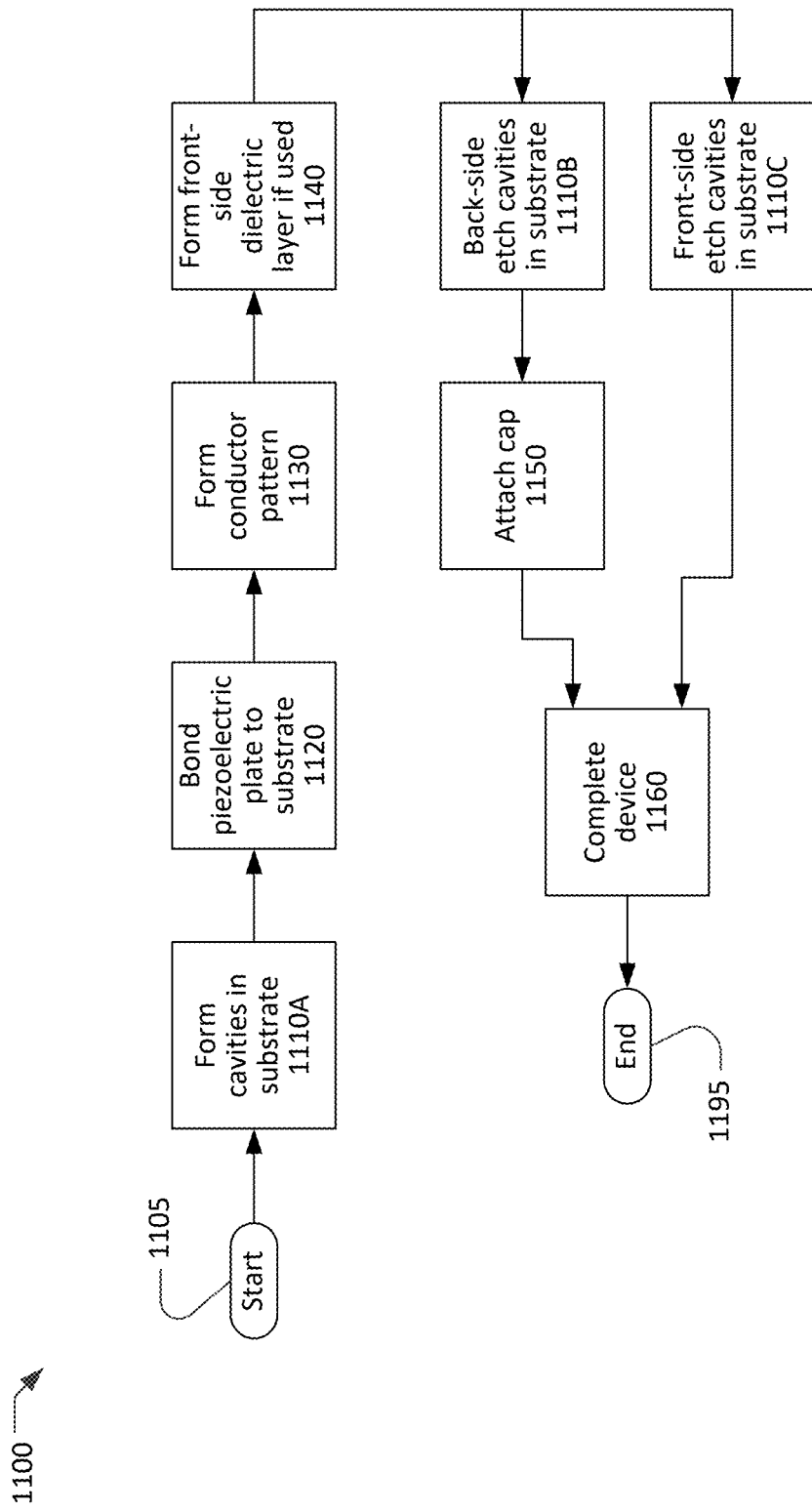
FIG. 11 is a flow chart of a process for fabricating an XBAR chip.

FIG. 11 is a simplified flow chart showing a process 1100 for making an XBAR filter chip. The process 1100 starts at 1105 with a substrate and a plate of piezoelectric material and ends at 1195 with a completed XBAR filter chip. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

The flow chart of FIG. 11 captures three variations of the process 1100 for making an XBAR filter chip which differ in when and how cavities are formed in the substrate. The cavities may be formed at steps 1110A, 1110B, or 1110C. Only one of these steps is performed in each of the three variations of the process 1100.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

In one variation of the process 1100, one or more cavities are formed in the substrate at 1110A, before the piezoelectric plate is bonded to the substrate at 1120. A separate cavity may be formed for each resonator in a filter device. The one or more cavities may be formed using conventional photo-lithographic and etching techniques. Typically, the cavities formed at 1110A will not penetrate through the substrate, and the resulting resonator devices will have a cross-section as shown in FIG. 3A or FIG. 3B.

At 1120, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1130 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs). In some cases, the conductor pattern includes electrical connections that connect the shunt resonators and the series resonators in a bandpass ladder filter architecture, such as shown in FIG. 5B.

The conductor pattern may be formed at 1130 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1130 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1140, a front-side dielectric layer may be formed by depositing one or more layers of dielectric material on the front side of the piezoelectric plate, over one or more desired conductor patterns of IDT or XBAR devices. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. In some cases, depositing at 1140 includes depositing a first thickness of at least one dielectric layer over the front-side surface of selected IDTs, but no dielectric or a second thickness less than the first thickness of at least one dielectric over the other IDTs. An alternative is where these dielectric layers are only between the interleaved fingers of the IDTs.

The different thickness of these dielectric layers causes the selected XBARs to be tuned to different frequencies as compared to the other XBARs. For example, the resonance frequencies of the XBARs in a filter may be tuned using different front-side dielectric layer thickness on some XBARs.

As compared to the admittance of an XBAR with tfd=0 (i.e. an XBAR without dielectric layers), the admittance of an XBAR with tfd=30 nm dielectric layer reduces the resonant frequency by about 145 MHz compared to the XBAR without dielectric layers. The admittance of an XBAR with tfd=60 nm dielectric layer reduces the resonant frequency by about 305 MHz compared to the XBAR without dielectric layers. The admittance of an XBAR with tfd=90 nm dielectric layer reduces the resonant frequency by about 475 MHz compared to the XBAR without dielectric layers. Importantly, the presence of the dielectric layers of various thicknesses has little or no effect on the piezoelectric coupling.

In one example, a first thickness of a first dielectric layer deposited between the fingers of the IDT of one or more shunt resonators that is greater than a second thickness of a second dielectric layer deposited between the fingers of the IDT of one or more series resonators. A difference between the first thickness and the second thickness is sufficient to set the resonance frequency of the shunt resonator at least 140 MHz lower than the resonance frequency of the series resonator.

In a second variation of the process 1100, one or more cavities are formed in the back-side of the substrate at 1110B. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In the second variation of the process 1100, a cap, such as the caps 480, 780, 980, 1080, may be attached to the substrate at 1150 to cover and seal the cavities formed at 1110B. The cap may a plate of silicon, glass, or some other material or a plate or film of a polymer material. The cap may be attached to the substrate using any of the previously discussed bonding techniques.

In a third variation of the process 1100, one or more cavities in the form of recesses in the substrate may be formed at 1110C by etching the substrate using an etchant introduced through openings in the piezoelectric plate. A separate cavity may be formed for each resonator in a filter device. The one or more cavities formed at 1110C will not penetrate through the substrate, and the resulting resonator devices will have a cross-section as shown in FIG. 3A or FIG. 3B.

In all variations of the process 1100, the XBAR filter chip is completed at 1160. Actions that may occur at 1160 include depositing an encapsulation/passivation layer such as $SiO_2$ or $Si_3O_4$ over all or a portion of the device; forming bonding pads or solder bumps or other means for making connection between the device and external circuitry; and, if necessary, tuning the resonant frequencies of the resonators within the device by adding or removing metal or dielectric material from the front side of the device. At the conclusion of 1160, the XBAR filter chip is ready to be packaged. The process 1100 then ends at 1195.

Figure 12A:
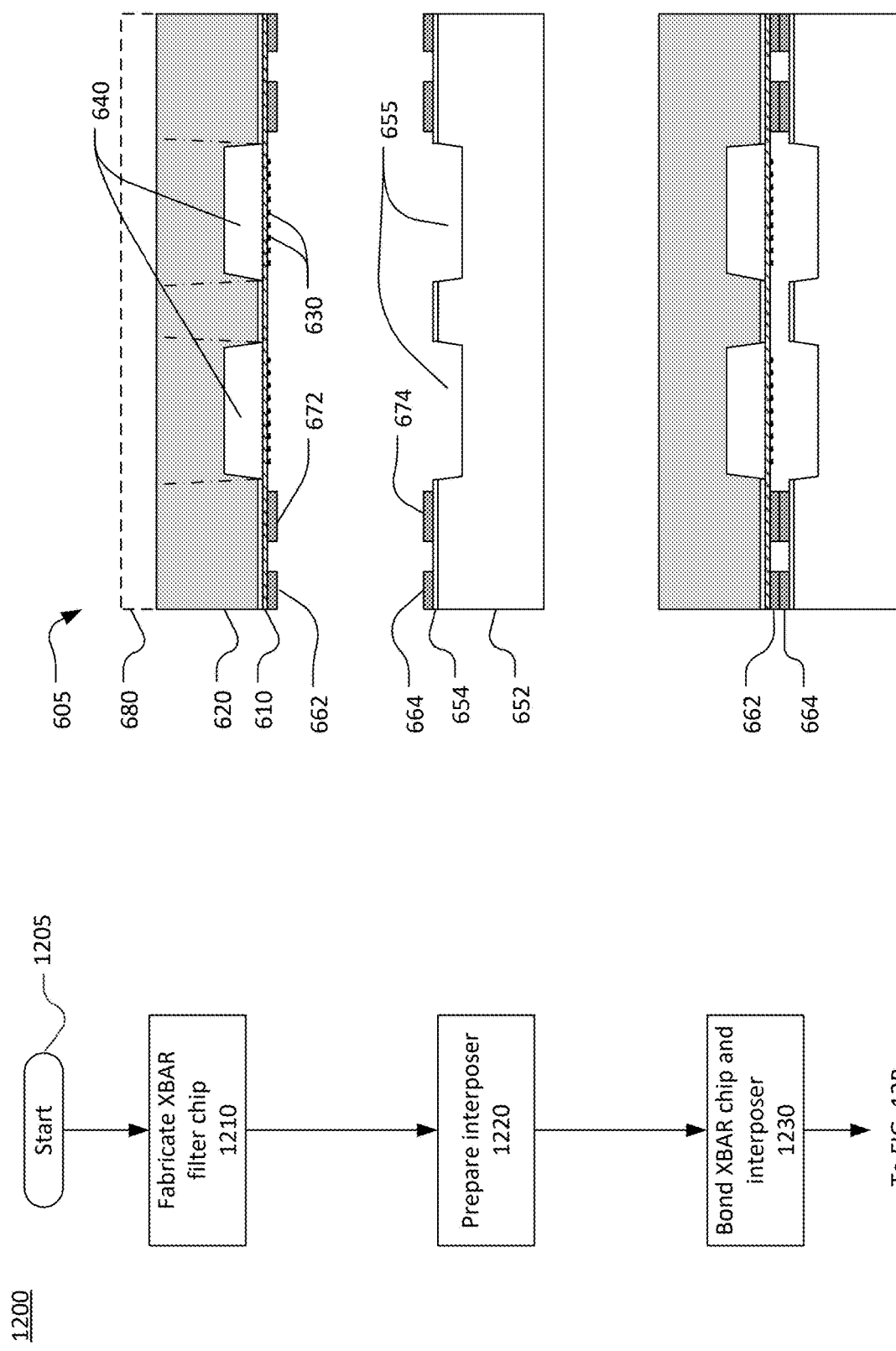
Figure 12C:
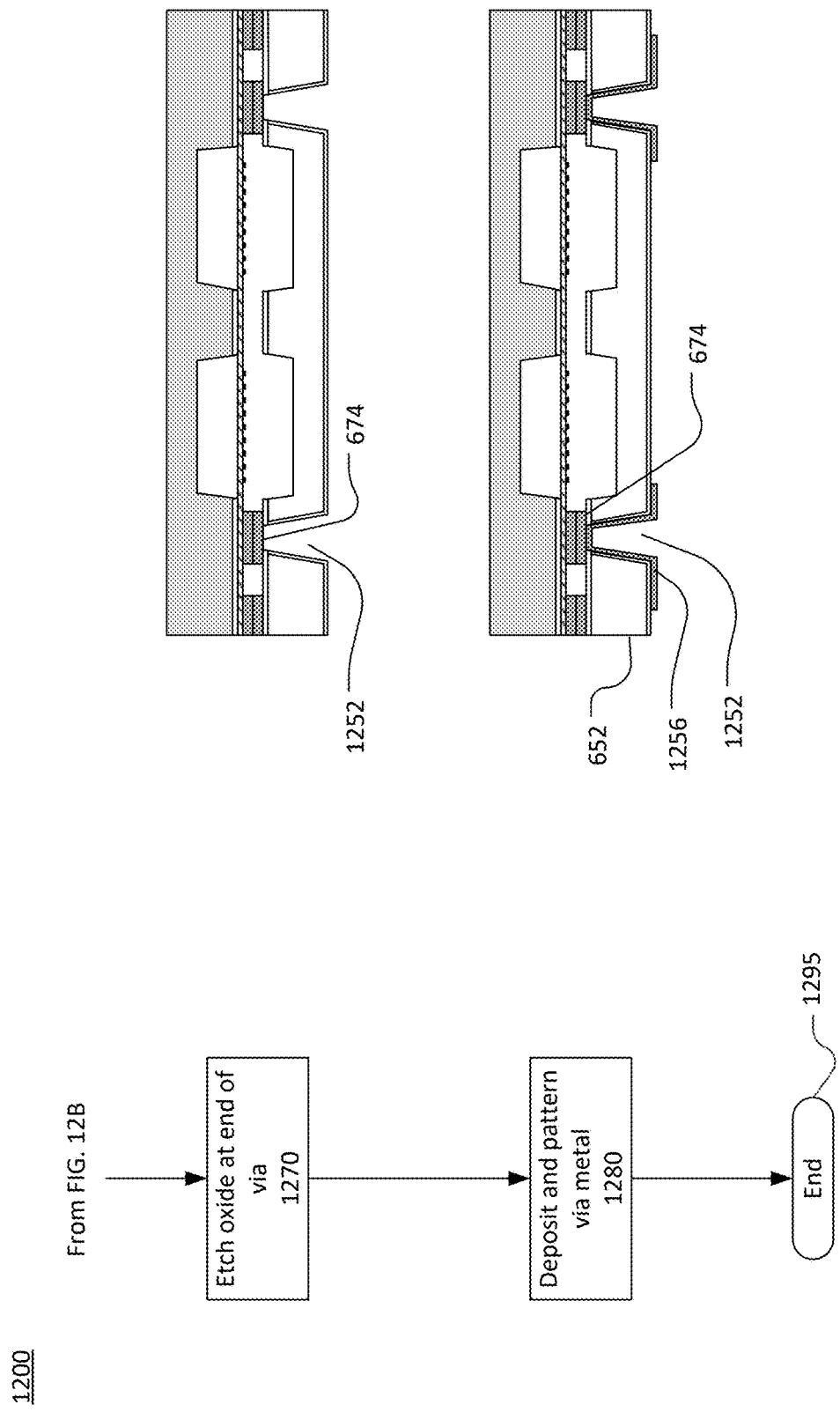

FIG. 12A, FIG. 12B, and FIG. 12C are, in combination, a flow chart of process 1200 for fabricating a package XBAR filter using a silicon interposer with TSVs (through silicon vias). While FIG. 12A, FIG. 12B, and FIG. 12C illustrate the process 1200 with an XBAR filter chip with front-side etched cavities, the process 1200 may also use an XBAR filter chip with back-side etched cavities.

The process 1200 starts at 1205 and ends at 1295 with a completed packaged XBAR filter. FIG. 12A, FIG. 12B, and FIG. 12C show major process actions, each of which may involve multiple steps. Various conventional process steps (e.g. surface preparation, cleaning, inspection, baking, annealing, monitoring, testing, etc.) may be performed before, between, after, and during the steps shown in FIG. 12A, FIG. 12B, and FIG. 12C. For each major process action, a corresponding schematic cross-sectional view is provided to illustrate the configuration of the work-in-progress at the conclusion of the action. Where appropriate, reference designators previously used in FIG. 6 are used to identify elements of the work-in-progress.

Referring to FIG. 12A, at 1210, a XBAR filter chip 605 is fabricated using, for example, the process 1100 of FIG. 11. The XBAR filter chip 605 includes a piezoelectric plate 610 attached to a substrate 620. The substrate 620 may be high resistivity silicon or some other material. Portions of the piezoelectric plate 610 form diaphragms spanning respective cavities 640 in the substrate 620. A first conductor pattern is formed on the surface of the piezoelectric plate 610. The first conductor pattern includes IDTs with interleaved IDT fingers, such as fingers 630, disposed on the diaphragms.

When the XBAR filter chip 605 has back-side etched cavities (as shown by the dot-dash lines), a cover 680 is sealed to the back side of the substrate 620. While the cover 680 is not shown in subsequent cross-sectional views in FIG. 12A, FIG. 12B, and FIG. 12C, it must be understood that all of the actions in the process 1200 are compatible with a XBAR filter chip having a cover over back-side etched cavities.

A second conductor pattern is formed on the surface of the piezoelectric plate 610. The second conductor pattern, which may overlay portions of the first conductor pattern, may be gold, aluminum, copper or some other metal. The second conductor pattern includes a continuous metal ring 662 around the perimeter of the XBAR filter chip 605. The second conductor pattern also includes pads, such as pad 672, in locations where portions of the first conductor pattern must be connected to circuitry external to the packaged XBAR filter.

At 1220, a partially-completed interposer is prepared. The partially-completed interposer includes a base 652, which may be high resistivity silicon or some other material. A dielectric layer 654, such as silicon dioxide, is formed on the surface of the base that will face the XBAR filter chip. The base 652 may have recesses 655 so that the surfaces of the base 652 that will face the diaphragms (i.e. the bottoms of the recesses 655) are sufficiently far from the diaphragms. The dielectric layer 654 may or may not cover the recesses 655. A third conductor pattern is formed on top of the dielectric layer 654. The third conductor pattern may be the same material as the second conductor pattern. The third conductor pattern includes a continuous metal ring 664 around the perimeter of the base 652. The third conductor pattern also includes pads, such as pad 674, in locations where portions of the first conductor pattern must be connected to circuitry external to the packaged XBAR filter. The arrangement of ring 664 and pads 674 of third conductor pattern is typically a mirror image of the arrangement of the ring 662 and pads 672 of the second conductor pattern.

At 1230, the XBAR filter chip 605 is bonded to the partially-completed interposer. Specifically, the ring 662 of the second conductor pattern is bonded to the ring 664 of the third conductor pattern, forming a hermetic seal around the perimeter of the XBAR filter chip and partially-completed interposer. Simultaneously, pads, such as pad 672, on the XBAR filter chip are bonded to corresponding pads, such as pad 674, on the partially-completed interposer. A preferred method of bonding the XBAR filter chip to the partially competed interposer is thermocompression bonding, which uses a combination of heat and pressure to make bonds between metallic layers. Other methods, including ultrasonic bonding, and solder or eutectic bonding may be used.

Referring now to FIG. 12B, at 1240, one or both of the substrate 620 and the XBAR filter chip, and the base 652 of the partially-completed interposer may be thinned to reduce the overall height of the package XBAR filter. The substrate 620 and/or the base 652 may be thinned, for example, by mechanical or chemo-mechanical polishing.

After the optional thinning of one or both of the substrate 620 and the base 652, through silicon via are formed in a sequence of actions from 1250 to 1280.

At 1250, deep reactive ion etching (DRIE) is used to etch holes 1252 from the back side (the lower side as shown in FIG. 12B) of the base 652 through the base 652 to the dielectric layer 654. The dielectric layer 654 is not affected by the DRIE process, so the depth of the etch holes will be precisely controlled and uniform. The locations of the etched holes 1252 correspond to the locations of the pads, such as pad 674, of the third conductor pattern.

At 1260, a dielectric layer 1262 is deposited over the back side of the base 652 and the interiors of the holes 1252. The dielectric layer may be silicon dioxide, silicon nitride, aluminum oxide, or some other dielectric material. The dielectric layer may be deposited by a conventional process such as evaporation, sputtering, chemical vapor deposition, or some other process.

Referring now to FIG. 12C, at 1270, the oxide layer at the ends of the holes 1252 is etched through a patterned photoresist mask to expose at least a portion of each contact pad (such as pad 674) of the third conductor pattern.

At 1280, a fourth conductor pattern 1256 is formed to create electric connections from the pads, such as pad 674 of the third conductor pattern, to corresponding pads, such as pad 676 on the exterior surface (the lower surface as shown in FIG. 12C) of the base 652. The fourth conductor pattern may include a primary conductive layer of gold, aluminum, copper or some other highly conductive material. A thin layer of some other metal, such as titanium or nickel may be disposed between the primary conductive layer and the base 652 to improve adhesion. The structures including the holes 1252 and the fourth conductor pattern is commonly referred to as "through silicon vias". Once the through silicon vias are complete, the process 1200 ends at 1295.

The entire process 1200 may be, and commonly will be, performed on whole wafers. A whole wafer containing multiple XBARs filter chips will be bonded to another wafer containing a corresponding number of partially-completed interposers at 1230. The subsequent actions form TSVs for all of the interposers simultaneously. Individual packaged XBAR filters may then be excised by dicing the bonded wafers after action 1230.

Figure 13:
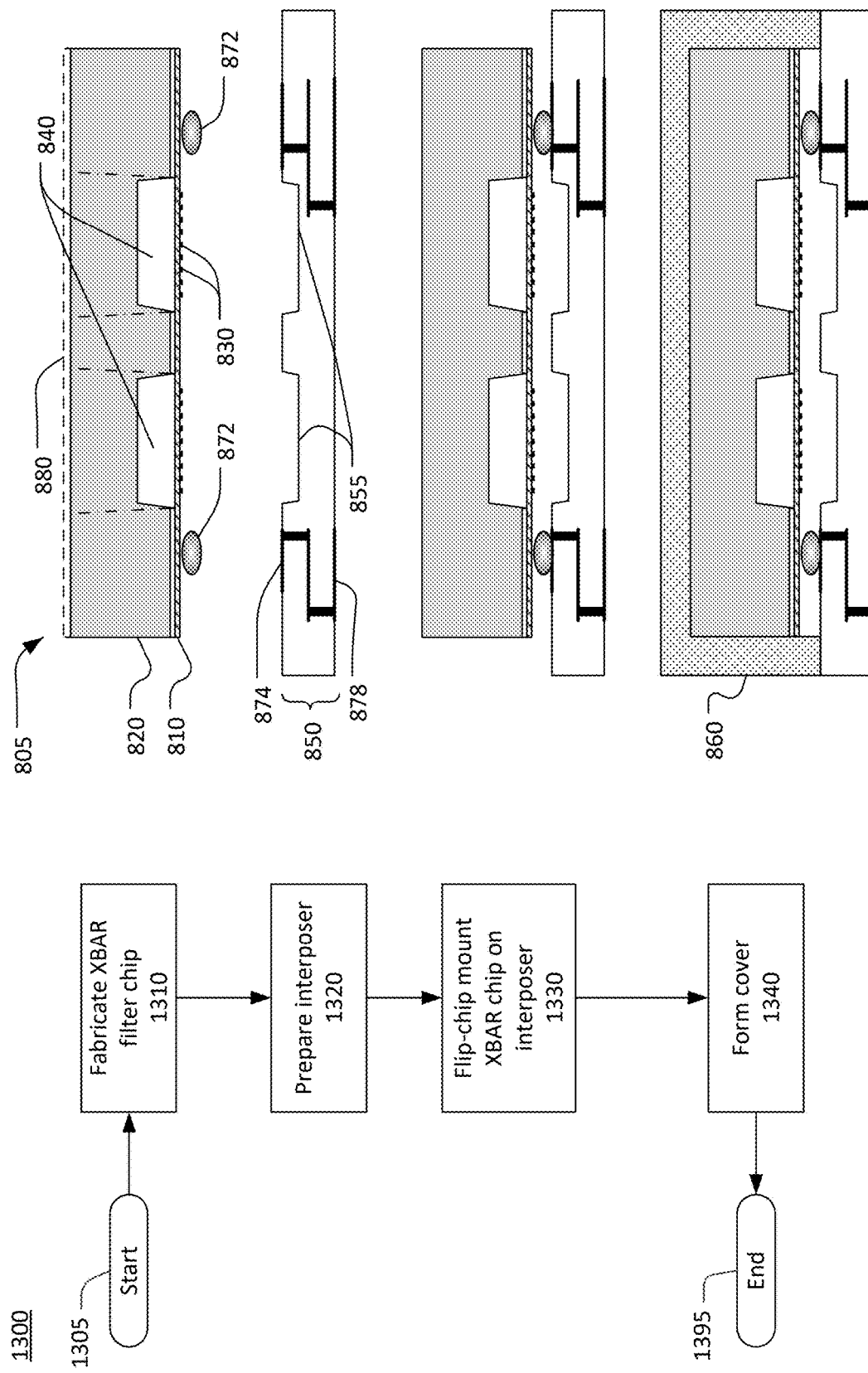
FIG. 13 is a flow chart of another process for packaging an XBAR filter.

FIG. 13 is a flow chart of another process 1300 for fabricating a package XBAR filter using a LTCC interposer. While FIG. 13 illustrates the process 1300 with an XBAR filter chip with front-side etched cavities, the process 1300 may also use an XBAR filter chip with back-side etched cavities.

The process 1300 starts at 1305 and ends at 1395 with a completed packaged XBAR filter. FIG. 13 shows major process actions, each of which may involve multiple steps. Various conventional process steps (e.g. surface preparation, cleaning, inspection, baking, annealing, monitoring, testing, etc.) may be performed before, between, after, and during the steps shown in FIG. 13. For each major process action, a corresponding schematic cross-sectional view is provided to illustrate the configuration of the work-in-progress at the conclusion of the action. Where appropriate, reference designators previously used in FIG. 8 are used to identify elements of the work-in-progress.

At 1310, a XBAR filter chip 805 is fabricated using, for example, the process 1100 of FIG. 11. The XBAR filter chip 805 will typically be a portion of a wafer containing multiple XBAR filter chips. The XBAR filter chip 805 includes a piezoelectric plate 810 attached to a substrate 820. The substrate 820 may be high resistivity silicon or some other material. Portions of the piezoelectric plate 810 form diaphragms spanning respective cavities 840 in the substrate 820. A first conductor pattern is formed on the surface of the piezoelectric plate 810. The first conductor pattern includes IDTs with interleaved IDT fingers, such as fingers 830, disposed on the diaphragms.

When the XBAR filter chip 805 has back-side etched cavities (as shown by the dot-dash lines), a cover or cap 880 is sealed to the back side of the substrate 820. While the cover 880 is not shown in subsequent cross-sectional views in FIG. 13, it must be understood that all of the actions in the process 1300 are compatible with a XBAR filter chip having a cap over back-side etched cavities.

A second conductor pattern is formed on the surface of the piezoelectric plate 810. The second conductor pattern, which may overlay portions of the first conductor pattern, may be gold, aluminum, copper or some other metal. The second conductor pattern may include pads (not identified) in locations where portions of the first conductor pattern must be connected to circuitry external to the packaged XBAR filter. Solder balls or bumps 872 may be formed on the pads to allow the XBAR filter chip 805 to be reflow soldered to an interposer. Alternatively, gold bumps may be formed on the pads to allow the XBAR filter chip 805 to be thermocompression bonded or ultrasonic bonded to an interposer.

At 1320, a LTCC interposer 850 is fabricated by cofiring thin ceramic layers, some or all of which bear printed conductors. The LTCC interposer 850 will typically be a portion of a larger panel including multiple interposers, An LTCC interposer has at least an upper (as shown in FIG. 13) conductor pattern 874 that includes pads for connections to the XBAR filter chip and a lower conductor pattern 878 that includes pads for connection to circuitry external to the package XBAR filter. In the example of FIG. 13, the interposer 850 includes one intermediate conductor layer. An LTCC interposer for an XBAR filter may have more than three conductor layers. The availability of multiple conductor layers allows incorporation of passive components, such as inductors, into the interposer.

The LTCC interposer 850 may have recesses 855 to ensure sufficient spacing between the diaphragms and the surfaces of the interposer facing the diaphragms. Such recess may be formed, for example, by punching openings in one or more of the ceramic layers prior to cofiring the layers of the interposer.

At 1330, the XBAR filter chip 850 is flip-chip bonded to the interposer 850. First the XBAR filter chips within a wafer are tested, and good chips are excised from the wafer. The good chips are then bonded to the LTCC interposer 850 by soldering, thermocompression bonding, ultrasonic bonding, or some other bonding method. The bonding physically attaches the XBAR filter chip 805 to the interposer 850 and makes electrical connections between the XBAR filter chip 805 and the interposer 850. The bonding typically does not make a seal to protect the diaphragms of the XBAR filter chip 805.

At 1340, a polymer cover 860 is formed over the XBAR filter chip 805 to seal the space between the XBAR filter chip 805 and the interposer 850. The cover 850 may be formed by injection molding or casting, for example. Individual covers may be formed over each XBAR filter chip, or a unitary cover 850 may be formed over the entire LTCC panel. In either case, packages XBAR filters may be excised from the panel by, for example, sawing. The process 1300 then ends at 1395.

Figure 14:
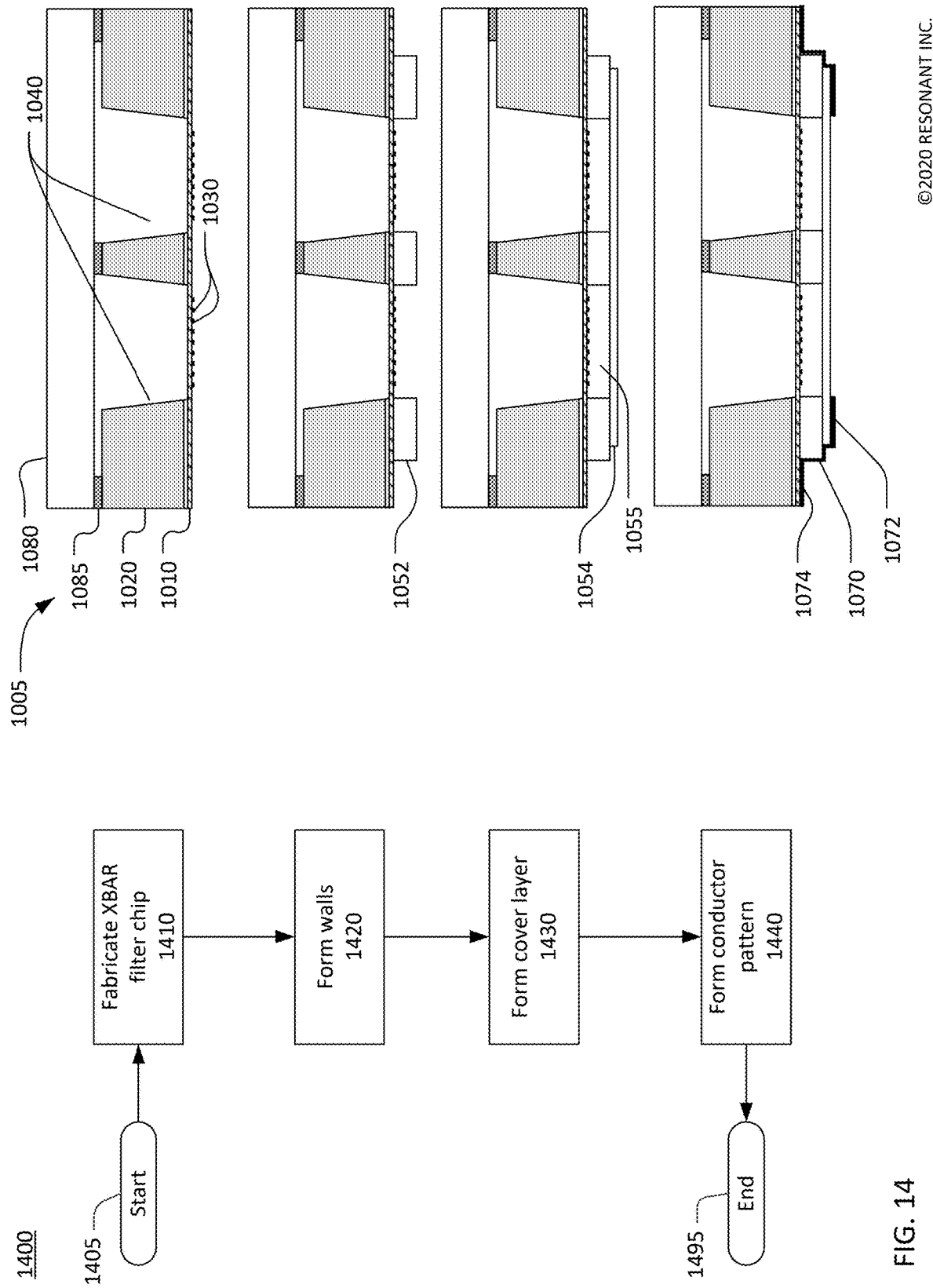
FIG. 14 is a flow chart of another process for packaging an XBAR filter.

FIG. 14 is a flow chart of another process 1400 for fabricating a package XBAR filter using a wafer-level built up interposer. The process 1400 starts at 1405 and ends at 1495 with a completed packaged XBAR filter. FIG. 14 shows major process actions, each of which may involve multiple steps. Various conventional process steps (e.g. surface preparation, cleaning, inspection, baking, annealing, monitoring, testing, etc.) may be performed before, between, after, and during the steps shown in FIG. 14. For each major process action, a corresponding schematic cross-sectional view is provided to illustrate the configuration of the work-in-progress at the conclusion of the action. Where appropriate, reference designators previously used in FIG. 10 are used to identify elements of the work-in-progress.

At 1410, a XBAR filter chip 1005 is fabricated using, for example, the process 1100 of FIG. 11. The XBAR filter chip 1005 will typically be a portion of a wafer containing multiple XBAR filter chips. The XBAR filter chip 1005 includes a piezoelectric plate 1010 attached to a substrate 1020. The substrate 1020 may be high resistivity silicon or some other material. Portions of the piezoelectric plate 1010 form diaphragms spanning respective cavities 1040 in the substrate 1020. A first conductor pattern is formed on the surface of the piezoelectric plate 1010. The first conductor pattern includes IDTs with interleaved IDT fingers, such as fingers 1030, disposed on the diaphragms.

The subsequent actions in the process require liquid materials, such as solvents, photoresist, or photopolymerizable monomers, to be applied to the front side of the piezoelectric plate 1010 after the cavities 1040 have been etched. The process 1400 is not suitable for XBAR filter chips with front-side etched cavities because the liquid materials may pass into the cavities through the etch holes in the diaphragms. Thus, the XBAR filter chip 1005 has back-side etched cavities with a cover 1080 sealed to the back side of the substrate 1020.

At 1420, walls 1052 are formed on the piezoelectric plate 1010. The walls 1052 may be formed with openings over the XBAR diaphragms and openings where electrical connections to the XBAR filter chip will be made in a subsequent process action. The walls 1052 may be formed, for example, by coating the piezoelectric plate 1010 with a photopolymerizable material and then exposing the photopolymerizable material through a suitable mask. Depending on the required thickness of the walls, multiple layers of material may be coated and patterned in succession.

A 1430, a cover layer 1054 is applied over the walls 1052. The cover layer 1054 may be applied, for example, as a continuous film bonded to the walls 1052 by an adhesive. The cover layer 1054 spans the openings in the walls 1052 over the XBAR diaphragms, forming an enclosed cavity 1055 over each diaphragm. The cover layer is pattered to form openings where electrical connections to the XBAR filter chip will be made in a subsequent process action.

At 1440, a conductor pattern 1070 is formed. The conductor pattern 1070 includes pads 1072 on the external surface of the cover layer 1054 for connection to circuitry external to the packaged XBAR filter. The conductor pattern 1070 connects the pads 1072 to connection points 1074 on the XBAR filer chip 1005. The conductor pattern 1070 may be aluminum, copper, gold, or a combination of materials deposited and patterned using conventional techniques. Once the conductor pattern is formed, the process 1400 ends at 1495.

The entire process 1400 may be, and commonly will be, performed on whole wafers. Individual packaged XBAR filters may then be excised by sawing through the bonded wafers after the conductor pattern is formed at 1440.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
an acoustic resonator chip comprising:
  a substrate having front and back surfaces;
  at least one piezoelectric layer having front and back surfaces, the back surface attached to the front surface of the substrate either directly or via one or more intermediate layers, the at least one piezoelectric layer having portions that form at least two diaphragms over at least two chip cavities;
  a first conductor pattern formed as one or more conductor layers on the front surface of the at least one piezoelectric layer, the first conductor pattern including:
    at least two interdigitated transducers (IDTs), interleaved fingers of each of the IDTs disposed on one of the diaphragms, and
    a first plurality of contact pads;
an interposer comprising:
  interposer front and back surfaces;
  walls on the interposer back surface and attached to the acoustic resonator chip, wherein the walls surround the at least two diaphragms;
  a cover layer over the walls and that forms an enclosed interposer cavity over each of the at least two diaphragms; and
  a second conductor pattern formed on a back surface of the walls and the cover layer, the second conductor pattern including:
    a second plurality of contact pads on the interposer back surface; and
    a plurality of electrical connections between the second plurality of contact pads and connection points on the chip;
  wherein the plurality of electrical connections electrically connect first ones of the contact pads of the first plurality of contact pads to respective contact pads of the second plurality of contact pads.

2. The acoustic resonator device of claim 1, wherein
the cover layer comprises openings through which the plurality of electrical connections extend from the second plurality of contact pads to the connection points on the chip; and
the second conductor pattern is formed on the walls, on the cover layer and on the first plurality of contact pads.

3. The acoustic resonator device of claim 1, wherein
the at least two chip cavities are holes passing through a thickness of the substrate, and
the acoustic resonator device further comprises a cap bonded to the back surface of the substrate, wherein the cap forms a seal over the at least two chip cavities.

4. The acoustic resonator device of claim 3, wherein
the walls and the cover layer are a polymer material; and
the cap is one of a silicon, a glass, a quartz, a polymer plate or a polymer film material.

5. The acoustic resonator device of claim 4, wherein the cover is a continuous film bonded to the walls by an adhesive.

6. The acoustic resonator device of claim 1, wherein the second plurality of contact pads are formed on an external surface of the cover layer for connection to circuitry external to the chip.

7. The acoustic resonator device of claim 1, wherein
the second conductor pattern is aluminum, copper, gold, or a combination thereof; and
wherein the at least two portions of the at least one piezoelectric layer are portions of a single piezoelectric layer.

8. The acoustic resonator device of claim 1, wherein the interposer cavities are in the interposer back surface facing the diaphragm below the enclosed interposer cavity; and a distance defined by the thickness of the walls from the cover layer to the diaphragm is greater than or equal to 15 microns and less than or equal to 100 microns.

9. The acoustic resonator device of claim 1, wherein the at least two IDTs and the at least one piezoelectric layer are configured such that a radio frequency signal applied to the at least two IDTs excites a shear primary acoustic mode in the at least one piezoelectric layer.

10. The acoustic resonator device of claim 9, wherein
the at least one piezoelectric layer is a single-crystal piezoelectric plate; and
a direction of acoustic energy flow of the primary shear acoustic mode is substantially orthogonal to the front and back surfaces of the single-crystal piezoelectric plate.

11. The acoustic resonator device of claim 1, wherein
a thickness between the front and back surfaces of the at least one piezoelectric layer is greater than or equal to 200 nm and less than or equal to 1000 nm;
a pitch of the interleaved fingers of the at least two IDTs is greater than or equal to 2 times the thickness of the at least one piezoelectric layer and less than or equal to 20 times the thickness of the at least one piezoelectric layer;
the interleaved fingers of the at least two IDTs have a width, and the pitch is greater than or equal to 2 times the width and less than or equal to 20 times the width; and
the diaphragm is contiguous with the at least one piezoelectric layer around at least 50% of a perimeter of the at least two chip cavities.

12. The acoustic resonator device of claim 1, wherein
the at least two IDTs include at least one shunt resonator and at least one series resonator,
a first thickness of a first dielectric layer deposited between the fingers of the respective IDT of the shunt resonator is greater than a second thickness of a second dielectric layer deposited between the fingers of the respective IDT of the series resonator,
a resonance frequency of the shunt resonator is set, at least in part, by the first thickness,
a resonance frequency of the series resonator is set, at least in part, by the second thickness; and
a difference between the first thickness and the second thickness configures the resonance frequency of the shunt resonator to be at least 140 MHz lower than the resonance frequency of the series resonator.

13. The acoustic resonator device of claim 12, wherein the at least two IDTs include at least five IDTs, wherein:
a recess is provided in the interposer facing the diaphragm;

a distance from a bottom of the recess to the diaphragm is greater than or equal to 15 microns and less than or equal to 100 microns; and wherein the first conductor pattern includes electrical connections that connect the shunt resonators and the series resonators in a bandpass ladder filter architecture.

14. An acoustic resonator device comprising:
an acoustic resonator chip comprising:
a substrate having front and back surfaces;
at least one piezoelectric layer having front and back surfaces, the back surface attached to the front surface of the substrate either directly or via one or more intermediate layers, the at least one piezoelectric layer having portions that form at least two diaphragms over at least two chip cavities;
a first conductor pattern formed as one or more conductor layers on the front surface of the at least one piezoelectric layer, the first conductor pattern including:
at least two interdigitated transducers (IDTs) comprising two bus bars and interleaved fingers, the interleaved fingers of each of the at least two IDTs are disposed on one of the at least two diaphragms;
the at least one piezoelectric layer and at least two IDTs are configured so that a radio frequency or microwave signal applied between the two busbars excites a bulk shear acoustic wave in the at least two diaphragms, respectively; and
a first plurality of contact pads;
an interposer comprising:
interposer front and back surfaces;
walls on the interposer back surface and attached to the acoustic resonator chip, wherein the walls surround the at least two diaphragms;
a cover layer formed over the walls and that form an enclosed interposer cavity over each of the at least two diaphragms; and
a second conductor pattern formed on a back surface of the walls and the cover layer, the second conductor pattern including:
a second plurality of contact pads on the interposer back surface; and
a plurality of electrical connections between the second plurality of contact pads and connection points on the chip;
wherein the plurality of electrical connections electrically connect first ones of the contact pads of the first plurality of contact pads to respective contact pads of the second plurality of contact pads.

15. The acoustic resonator device of claim 14, wherein the cover layer comprises openings through which the plurality of electrical connections extend from the second plurality of contact pads to the connection points on the chip; and
the second conductor pattern is formed on the walls, on the cover layer and on the first plurality of contact pads.

16. The acoustic resonator device of claim 14, wherein the at least two chip cavities are holes passing through a thickness of the substrate, and
the acoustic resonator device further comprises a cap bonded to the back surface of the substrate, wherein the cap forms a seal over the at least two chip cavities.

17. The acoustic resonator device of claim 14, wherein the cover is a continuous film bonded to the walls by an adhesive; and the second plurality of contact pads are formed on an external surface of the cover layer for connection to circuitry external to the chip.

18. A filter device, comprising:
an acoustic resonator chip comprising:
a substrate;
at least one piezoelectric layer having parallel front and back surfaces, the back surface attached to the substrate either directly or via one or more intermediate layers; and
a conductor pattern at the at least one piezoelectric layer and including a plurality of interdigital transducers (IDTs) of a respective plurality of resonators and a first plurality of contact pads; wherein:
interleaved fingers of each of the plurality of IDTs are disposed on respective portions of the at least one piezoelectric layer that are over one or more chip cavities;
a first thickness of a first dielectric layer deposited between the fingers of the respective IDT of a first resonator of a respective plurality of resonators; and
a second thickness of a second dielectric layer deposited between the fingers of the respective IDT of a second resonator of a respective plurality of resonators; and
an interposer comprising:
interposer front and back surfaces;
walls on the interposer back surface and attached to the acoustic resonator chip, wherein the walls surround the at least two diaphragms;
a cover layer over the walls and that form an enclosed interposer cavity over each of the at least two diaphragms; and
a second conductor pattern on a back surface of the walls and the cover layer, the second conductor pattern including:
a second plurality of contact pads on the interposer back surface; and
a plurality of electrical connections between the second plurality of contact pads and connection points on the chip;
wherein the plurality of electrical connections electrically connect first contact pads of the contact pads of the first plurality of contact pads to respective contact pads of the second plurality of contact pads.

19. The filter device of claim 18, wherein the enclosed interposer cavity is in the interposer back surface facing at least one diaphragm of the at least two diaphragms, and a distance defined by the thickness of the walls from the cover layer to the at least two diaphragm is greater than or equal to 15 microns and less than or equal to 100 microns.

20. The filter device of claim 19, wherein
the cover layer comprises openings through which the plurality of electrical connections extend from the second plurality of contact pads to the connection points on the chip; and
the second conductor pattern is formed on the walls, on the cover layer and on the first plurality of contact pads.

* * * * *